United States Patent
Zajac

(10) Patent No.: US 10,115,856 B2
(45) Date of Patent: Oct. 30, 2018

(54) SYSTEM AND METHOD FOR CURING CONDUCTIVE PASTE USING INDUCTION HEATING

(71) Applicant: SolarCity Corporation, San Mateo, CA (US)

(72) Inventor: Piotr Zajac, Foster City, CA (US)

(73) Assignee: Tesla, Inc., Palo Alto, CA (US)

( * ) Notice: Subject to any disclaimer, the term of this patent is extended or adjusted under 35 U.S.C. 154(b) by 64 days.

(21) Appl. No.: 15/339,573

(22) Filed: Oct. 31, 2016

(65) Prior Publication Data

US 2018/0122979 A1    May 3, 2018

(51) Int. Cl.
| | |
|---|---|
| H01L 31/02 | (2006.01) |
| H01L 31/18 | (2006.01) |
| H01L 31/0224 | (2006.01) |
| H01L 31/043 | (2014.01) |
| H01L 31/05 | (2014.01) |

(52) U.S. Cl.
CPC .... *H01L 31/188* (2013.01); *H01L 31/022425* (2013.01); *H01L 31/043* (2014.12); *H01L 31/0504* (2013.01)

(58) Field of Classification Search
None
See application file for complete search history.

(56) References Cited

U.S. PATENT DOCUMENTS

| | | |
|---|---|---|
| 3,603,284 A | 9/1971 | Garnache |
| 3,637,434 A | 1/1972 | Nakanuma |
| 3,658,585 A | 4/1972 | Folkmann |
| 3,675,619 A | 7/1972 | Burd |
| 3,699,298 A | 10/1972 | Briody |
| 3,796,182 A | 3/1974 | Rosler |
| 3,806,360 A | 4/1974 | Briody |
| 4,154,998 A | 5/1979 | Luft |
| 4,168,998 A | 9/1979 | Hasegawa |
| 4,193,756 A | 3/1980 | Leon |
| 4,268,374 A | 5/1981 | Lepselter |
| 4,298,443 A | 11/1981 | Maydan |

(Continued)

FOREIGN PATENT DOCUMENTS

| | | |
|---|---|---|
| CN | 101263590 | 9/2008 |
| CN | 102559134 | 7/2012 |

(Continued)

OTHER PUBLICATIONS

"Pad printing as a film forming technique for polymer solar cells" Krebs, F.C.

(Continued)

*Primary Examiner* — Evren Seven
(74) *Attorney, Agent, or Firm* — Shun Yao; Park, Vaughan, Fleming & Dowler LLP

(57) ABSTRACT

One embodiment can provide a system for curing conductive paste applied on photovoltaic structures using induction heating. The system can include a wafer carrier for carrying a plurality of photovoltaic structures and an induction heater. The wafer carrier can include a surface element that is in direct contact with the photovoltaic structures and is substantially thermally insulating. The induction heater can be positioned above the wafer carrier. The induction heater can include a heating coil and core that do not directly contact the photovoltaic structures.

20 Claims, 19 Drawing Sheets

(56) References Cited

U.S. PATENT DOCUMENTS

| | | | |
|---|---|---|---|
| 4,325,778 | A | 4/1982 | Lepselter |
| 4,355,974 | A | 10/1982 | Lee |
| 4,496,828 | A | 1/1985 | Kusmierz |
| 4,522,149 | A | 6/1985 | Garbis |
| 4,558,660 | A | 12/1985 | Nishizawa |
| 4,565,157 | A | 1/1986 | Brors |
| 4,579,080 | A | 4/1986 | Martin |
| 4,612,207 | A | 9/1986 | Jansen |
| 4,661,199 | A * | 4/1987 | Looney ............... C30B 25/12 117/935 |
| 4,668,484 | A | 5/1987 | Elliott |
| 4,747,367 | A | 5/1988 | Posa |
| 4,761,044 | A | 8/1988 | Akama |
| 4,761,269 | A | 8/1988 | Conger |
| 4,786,352 | A | 11/1988 | Benzing |
| 4,794,220 | A | 12/1988 | Sekiya |
| 4,807,562 | A | 2/1989 | Sandys |
| 4,823,736 | A | 4/1989 | Post |
| 4,838,983 | A | 6/1989 | Schumaker |
| 4,839,145 | A | 6/1989 | Gale |
| 4,858,558 | A | 8/1989 | Ohmura |
| 4,867,629 | A | 9/1989 | Iwasawa |
| 4,928,626 | A | 5/1990 | Carlson |
| 4,948,740 | A * | 8/1990 | Plaettner ............... H01L 31/043 136/244 |
| 4,967,645 | A | 11/1990 | Mattson |
| 4,993,559 | A | 2/1991 | Cota |
| 5,038,711 | A | 8/1991 | Dan |
| 5,053,247 | A | 10/1991 | Moore |
| 5,067,218 | A | 11/1991 | Williams |
| 5,074,245 | A | 12/1991 | Ota |
| 5,119,540 | A | 6/1992 | Kong |
| 5,121,531 | A | 6/1992 | Severns |
| 5,151,133 | A | 9/1992 | Ohmine |
| 5,207,835 | A | 5/1993 | Moore |
| 5,269,847 | A | 12/1993 | Anderson |
| 5,288,364 | A | 2/1994 | Burt |
| 5,350,455 | A | 9/1994 | Mahler |
| 5,351,415 | A | 10/1994 | Brooks |
| 5,373,806 | A | 12/1994 | Logar |
| 5,374,159 | A | 12/1994 | Severns |
| 5,427,824 | A | 6/1995 | Inushima |
| 5,441,571 | A | 8/1995 | Ohta |
| 5,452,795 | A | 9/1995 | Gallagher |
| 5,453,124 | A | 9/1995 | Moslehi |
| 5,458,918 | A | 10/1995 | Hawkins |
| 5,476,359 | A | 12/1995 | Severns |
| 5,505,778 | A | 4/1996 | Ono |
| 5,518,549 | A | 5/1996 | Hellwig |
| 5,532,190 | A | 7/1996 | Goodyear |
| 5,614,447 | A | 3/1997 | Yamaga |
| 5,629,245 | A | 5/1997 | Inushima |
| 5,700,422 | A | 12/1997 | Usui |
| 5,785,186 | A | 7/1998 | Babbs |
| 5,832,354 | A * | 11/1998 | Kouno ............... G03G 15/2053 219/619 |
| H1762 | H | 12/1998 | Kaempf |
| 5,871,586 | A | 2/1999 | Crawley |
| 5,916,369 | A | 6/1999 | Anderson |
| 5,950,925 | A | 9/1999 | Fukunaga |
| 5,960,960 | A | 10/1999 | Yamamoto |
| 5,964,948 | A | 10/1999 | Dietze |
| 5,993,555 | A | 11/1999 | Hamilton |
| 5,994,675 | A | 11/1999 | Bethune |
| 6,013,338 | A | 1/2000 | Inushima |
| 6,077,722 | A | 6/2000 | Jansen |
| 6,098,808 | A | 8/2000 | Matsuda |
| 6,110,289 | A | 8/2000 | Moore |
| 6,113,984 | A | 9/2000 | MacLeish |
| 6,120,605 | A | 9/2000 | Sato |
| 6,122,566 | A | 9/2000 | Nguyen |
| 6,129,048 | A | 10/2000 | Sullivan |
| 6,152,680 | A | 11/2000 | Howells |
| 6,193,804 | B1 | 2/2001 | Chang |
| 6,214,116 | B1 | 4/2001 | Shin |
| 6,217,662 | B1 | 4/2001 | Kong |
| 6,262,393 | B1 | 7/2001 | Imai |
| 6,328,169 | B1 | 12/2001 | Matsuda |
| 6,338,756 | B2 | 1/2002 | Dietze |
| 6,348,397 | B2 | 2/2002 | Ide |
| 6,370,791 | B1 | 4/2002 | Weaver |
| 6,399,510 | B1 | 6/2002 | Riley |
| 6,435,428 | B2 | 8/2002 | Kim |
| 6,472,284 | B2 | 10/2002 | Kim |
| 6,472,639 | B2 | 10/2002 | Nishitani |
| 6,478,923 | B1 | 11/2002 | Igarashi |
| 6,500,734 | B2 | 12/2002 | Anderson |
| 6,506,256 | B2 | 1/2003 | Ide |
| 6,530,990 | B2 | 3/2003 | Kong |
| 6,544,333 | B2 | 4/2003 | Keck |
| 6,562,128 | B1 | 5/2003 | Dietze |
| 6,586,270 | B2 | 7/2003 | Tsuzuki et al. |
| 6,637,988 | B1 | 10/2003 | Park |
| 6,679,672 | B1 | 1/2004 | Barrows |
| 6,716,027 | B2 | 4/2004 | Kim |
| 6,747,249 | B2 | 6/2004 | Robinson |
| 6,808,352 | B2 | 10/2004 | Seita |
| 6,814,811 | B2 | 11/2004 | Ose |
| 6,916,399 | B1 | 7/2005 | Rozenzon |
| 6,923,325 | B2 | 8/2005 | Duban-Hu |
| 6,934,145 | B2 | 8/2005 | Hsieh |
| 6,948,623 | B2 | 9/2005 | Takano |
| 6,959,823 | B2 | 11/2005 | Jun |
| 7,153,368 | B2 | 12/2006 | Preti |
| 7,159,537 | B2 | 1/2007 | Wickramanayaka |
| 7,225,934 | B2 | 6/2007 | Shon |
| 7,270,713 | B2 | 9/2007 | Blonigan |
| 7,273,526 | B2 | 9/2007 | Shinriki |
| 7,293,950 | B2 | 11/2007 | Bonora |
| 7,313,452 | B2 | 12/2007 | Kobayashi |
| 7,314,526 | B1 | 1/2008 | Preti |
| 7,354,622 | B2 | 4/2008 | Shinriki |
| 7,357,842 | B2 | 4/2008 | Ishikawa |
| 7,410,340 | B2 | 8/2008 | Bonora |
| 7,442,562 | B2 | 10/2008 | Onishi |
| 7,462,246 | B2 | 12/2008 | Hellwig |
| 7,628,863 | B2 | 12/2009 | Sen |
| 7,819,261 | B2 | 10/2010 | Mayuzumi |
| 7,897,525 | B2 | 3/2011 | Lei |
| 7,900,776 | B2 | 3/2011 | Burns |
| 7,918,938 | B2 | 4/2011 | Provencher |
| 7,988,399 | B2 | 8/2011 | vanderMeulen |
| 7,989,729 | B1 * | 8/2011 | Zhao ............... G01J 1/08 136/244 |
| 8,034,667 | B2 | 10/2011 | Shinoda |
| 8,080,107 | B2 | 12/2011 | Kennedy |
| 8,110,511 | B2 | 2/2012 | Lei |
| 8,133,323 | B2 | 3/2012 | Kakegawa |
| 8,173,473 | B2 | 5/2012 | Aqui |
| 8,183,132 | B2 | 5/2012 | Nijhawan |
| 8,231,799 | B2 | 7/2012 | Bera |
| 8,246,284 | B2 | 8/2012 | Borden |
| 8,257,547 | B2 | 9/2012 | Pei |
| 8,268,078 | B2 | 9/2012 | Suzuki |
| 8,268,734 | B2 | 9/2012 | Lei |
| 8,288,645 | B2 | 10/2012 | Lee |
| 8,367,565 | B2 | 2/2013 | Lei |
| 8,388,753 | B2 | 3/2013 | Pei |
| 8,404,049 | B2 | 3/2013 | Hellwig |
| 8,430,962 | B2 | 4/2013 | Masuda |
| 8,435,424 | B2 | 5/2013 | Hsu |
| 8,448,598 | B2 | 5/2013 | Pei |
| 8,481,844 | B2 | 7/2013 | Nishida |
| 8,500,388 | B2 | 8/2013 | vanderMeulen |
| 8,528,750 | B2 | 9/2013 | Heo |
| 8,539,908 | B2 | 9/2013 | Takagi |
| 8,562,745 | B2 | 10/2013 | Rozenzon |
| 8,563,998 | B2 | 10/2013 | Wegleiter |
| 8,608,854 | B2 | 12/2013 | Pei |
| 8,686,283 | B2 | 4/2014 | Heng |
| 8,691,620 | B2 | 4/2014 | Lee |
| 8,764,902 | B2 | 7/2014 | Suzuki |
| 8,778,079 | B2 | 7/2014 | Begarney |
| 8,808,454 | B2 | 8/2014 | Lee |

(56) References Cited

U.S. PATENT DOCUMENTS

| | | | |
|---|---|---|---|
| 8,877,000 B2 | 11/2014 | Strang | |
| 8,898,930 B2 | 12/2014 | Godot | |
| 8,967,081 B2 | 3/2015 | Borean | |
| 8,980,005 B2 | 3/2015 | Carlson | |
| 9,022,714 B2 | 5/2015 | Lee | |
| 9,105,673 B2 | 8/2015 | Babbs | |
| 9,117,670 B2 | 8/2015 | Abedijaberi | |
| 9,147,788 B2 | 9/2015 | DeGroot | |
| 9,159,864 B2 | 10/2015 | Lucas | |
| 9,205,505 B2 | 12/2015 | Sridharan | |
| 9,748,434 B1* | 8/2017 | Sung | H01L 31/1864 |
| 2001/0040100 A1 | 11/2001 | Wang | |
| 2002/0004309 A1 | 1/2002 | Collins | |
| 2002/0102859 A1 | 8/2002 | Yoo | |
| 2003/0012885 A1 | 1/2003 | Gramarossa | |
| 2003/0019428 A1 | 1/2003 | Ku | |
| 2003/0145791 A1 | 8/2003 | Shinya | |
| 2004/0135979 A1 | 7/2004 | Hazelton | |
| 2005/0016956 A1 | 1/2005 | Liu | |
| 2005/0061665 A1 | 3/2005 | Pavani | |
| 2005/0105991 A1 | 5/2005 | Hofmeister | |
| 2005/0199279 A1 | 9/2005 | Yoshimine et al. | |
| 2005/0208217 A1 | 9/2005 | Shinriki | |
| 2005/0226794 A1 | 10/2005 | Hodge | |
| 2005/0229848 A1 | 10/2005 | Shinriki | |
| 2006/0006559 A1 | 1/2006 | Nakagawa | |
| 2006/0016559 A1 | 1/2006 | Kobayashi | |
| 2006/0060791 A1 | 3/2006 | Hazelton | |
| 2006/0124169 A1 | 6/2006 | Mizusawa | |
| 2006/0156970 A1 | 7/2006 | Dong-Suk | |
| 2006/0191118 A1 | 8/2006 | Lee | |
| 2006/0191637 A1 | 8/2006 | Zajac | |
| 2006/0201414 A1 | 9/2006 | Brabant | |
| 2006/0231035 A1 | 10/2006 | Hellwig | |
| 2006/0292846 A1 | 12/2006 | Pinto | |
| 2007/0011863 A1 | 1/2007 | Yoshikawa | |
| 2007/0051314 A1 | 3/2007 | Choi | |
| 2007/0131173 A1 | 6/2007 | Halpin | |
| 2007/0175391 A1 | 8/2007 | Mizusawa | |
| 2007/0181181 A1 | 8/2007 | Mizusawa | |
| 2007/0247075 A1 | 10/2007 | Kim | |
| 2007/0249173 A1 | 10/2007 | Kim | |
| 2007/0251642 A1 | 11/2007 | Bera | |
| 2007/0254483 A1 | 11/2007 | Bera | |
| 2007/0254486 A1 | 11/2007 | Bera | |
| 2008/0000851 A1 | 1/2008 | Pickering | |
| 2008/0092944 A1 | 4/2008 | Rubin | |
| 2008/0176289 A1 | 7/2008 | Zeng | |
| 2008/0196757 A1 | 8/2008 | Yoshimine | |
| 2008/0276451 A1 | 11/2008 | Morad | |
| 2009/0014746 A1 | 1/2009 | Ramirez | |
| 2009/0067957 A1 | 3/2009 | Ando | |
| 2009/0081878 A1 | 3/2009 | Dhindsa | |
| 2009/0117746 A1 | 5/2009 | Masuda | |
| 2009/0139570 A1 | 6/2009 | Kinoshita | |
| 2009/0194235 A1 | 8/2009 | Kobayashi | |
| 2009/0311869 A1 | 12/2009 | Okesaku | |
| 2010/0009489 A1 | 1/2010 | Tu | |
| 2010/0029067 A1 | 2/2010 | Vijh | |
| 2010/0047954 A1 | 2/2010 | Su | |
| 2010/0092697 A1 | 4/2010 | Poppe | |
| 2010/0092698 A1 | 4/2010 | Poppe | |
| 2010/0096003 A1 | 4/2010 | Hobbie | |
| 2010/0132778 A1 | 6/2010 | Hong | |
| 2010/0162954 A1 | 7/2010 | Lei | |
| 2010/0167503 A1 | 7/2010 | Lei | |
| 2010/0171215 A1 | 7/2010 | Fischer | |
| 2010/0173439 A1 | 7/2010 | Lei | |
| 2010/0183825 A1 | 7/2010 | Becker | |
| 2010/0263587 A1 | 10/2010 | Sivaramakrishnan | |
| 2010/0273279 A1 | 10/2010 | Su | |
| 2010/0282272 A1 | 11/2010 | Godot | |
| 2010/0300506 A1 | 12/2010 | Yu | |
| 2010/0313877 A1 | 12/2010 | Bellman | |
| 2011/0033638 A1 | 2/2011 | Ponnekanti | |
| 2011/0033957 A1 | 2/2011 | Holden | |
| 2011/0048325 A1 | 3/2011 | Choi | |
| 2011/0067632 A1 | 3/2011 | Poppe | |
| 2011/0105293 A1* | 5/2011 | Gordon | C08G 73/18 501/1 |
| 2011/0140246 A1 | 6/2011 | Hoenk | |
| 2011/0151119 A1 | 6/2011 | Lei | |
| 2011/0177627 A1 | 7/2011 | Huegli | |
| 2011/0217469 A1 | 9/2011 | Lei | |
| 2011/0245957 A1 | 10/2011 | Porthouse | |
| 2011/0262252 A1 | 10/2011 | Lee | |
| 2011/0262628 A1 | 10/2011 | Sferlazzo | |
| 2011/0263070 A1 | 10/2011 | Schaeffer | |
| 2011/0277688 A1 | 11/2011 | Trujillo | |
| 2011/0277690 A1 | 11/2011 | Rozenzon | |
| 2011/0283941 A1 | 11/2011 | Rozenzon | |
| 2011/0285840 A1 | 11/2011 | Benson | |
| 2012/0009782 A1* | 1/2012 | De Wijs | H05K 3/1283 438/660 |
| 2012/0073974 A1 | 3/2012 | Abas | |
| 2012/0076936 A1* | 3/2012 | Hirano | C23C 16/45563 427/248.1 |
| 2012/0111271 A1* | 5/2012 | Begarney | C23C 16/45508 118/724 |
| 2012/0125391 A1 | 5/2012 | Pinarbasi | |
| 2012/0315395 A1 | 12/2012 | Kuribe | |
| 2012/0318340 A1 | 12/2012 | Heng et al. | |
| 2013/0171757 A1 | 7/2013 | Ponnekanti | |
| 2013/0269602 A1* | 10/2013 | Miyamoto | H01L 31/186 118/66 |
| 2014/0060633 A1 | 3/2014 | Lucas | |
| 2014/0086720 A1 | 3/2014 | Kao | |
| 2014/0124013 A1* | 5/2014 | Morad | H01L 31/0504 136/246 |
| 2014/0124713 A1 | 5/2014 | Majumdar | |
| 2014/0213016 A1 | 7/2014 | Sheng | |
| 2014/0287159 A1 | 9/2014 | Carmody | |
| 2014/0299256 A1 | 10/2014 | Sridharan | |
| 2014/0346035 A1 | 11/2014 | Fu | |
| 2015/0068587 A1 | 3/2015 | Lomasney | |
| 2015/0108107 A1 | 4/2015 | Liu | |
| 2015/0194374 A1 | 7/2015 | Ananiev | |
| 2015/0206780 A1 | 7/2015 | Choi | |
| 2015/0303079 A1 | 10/2015 | Oosterlaken | |
| 2015/0349703 A1* | 12/2015 | Morad | H01L 31/05 136/251 |
| 2015/0364356 A1 | 12/2015 | Moore | |
| 2015/0380577 A1* | 12/2015 | Loscutoff | H01B 1/20 136/256 |
| 2016/0009958 A1 | 1/2016 | Moore | |
| 2017/0125619 A1* | 5/2017 | Nakano | H01L 31/043 |

FOREIGN PATENT DOCUMENTS

| | | |
|---|---|---|
| CN | 102800746 | 11/2012 |
| CN | 103943727 | 7/2014 |
| CN | 104040732 | 9/2014 |
| CN | 103000253 | 5/2015 |
| CN | 104600158 | 5/2015 |
| CN | 105761778 | 7/2016 |
| DE | 3833703 | 5/1992 |
| EP | 2098609 | 9/2009 |
| EP | 2489759 | 8/2012 |
| JP | H071222622 | 5/1995 |
| JP | 07230942 | 8/1995 |
| JP | H07230942 | 8/1995 |
| JP | 11163089 | 6/1999 |
| JP | H11288890 A | 10/1999 |
| JP | 200068356 | 3/2000 |
| JP | 2000068356 | 3/2000 |
| JP | 2001284218 | 10/2001 |
| JP | 2002179207 | 6/2002 |
| JP | 2003158054 A | 5/2003 |
| JP | 2003277936 A | 10/2003 |
| JP | 2004296855 | 10/2004 |
| JP | 2006080098 A | 3/2006 |
| JP | 2007207762 | 8/2007 |
| JP | 2013033967 | 2/2013 |

(56) References Cited

FOREIGN PATENT DOCUMENTS

| | | |
|---|---|---|
| JP | 2013149596 | 8/2013 |
| JP | 2014007309 | 1/2014 |
| JP | 2014197592 | 10/2014 |
| KR | 20060117134 A | 11/2006 |
| KR | 1404986 | 6/2014 |
| KR | 20150137810 | 12/2015 |
| WO | 2011133965 | 10/1920 |
| WO | 0072362 | 11/2000 |
| WO | 2009029901 | 3/2009 |
| WO | 2009090172 | 7/2009 |
| WO | 2010129136 A2 | 11/2010 |
| WO | 2010129136 A3 | 11/2010 |
| WO | 2012128459 | 9/2012 |
| WO | 2012174432 | 12/2012 |
| WO | 2013124394 | 8/2013 |
| WO | 2014038277 | 3/2014 |
| WO | 2014045241 | 3/2014 |
| WO | 2014046810 | 3/2014 |
| WO | 2015163163 | 10/2015 |

OTHER PUBLICATIONS

"Thick-Film Materials for Silicon Photovoltaic Cell Manufacture" Field, M.B. Jan. 1997.
Beaucarne, G et al., "Epitaxial thin-film Si solar cells", pp. 533-542, Science Direct, www.sciencedirect.com, Thin Solid Films 511-512 (2006) 533-542 . . . .
Cebrian et al., "Paste Adhesive Modification for Induction Curing", Jan. 2012.

* cited by examiner

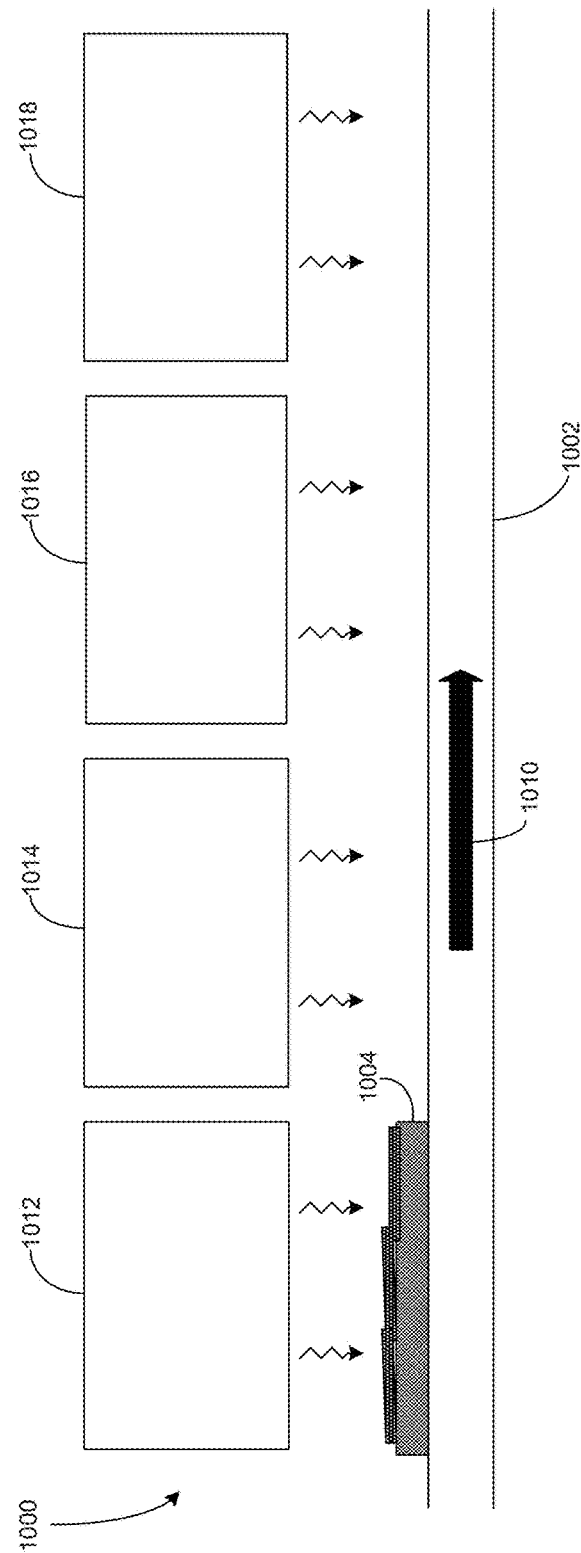

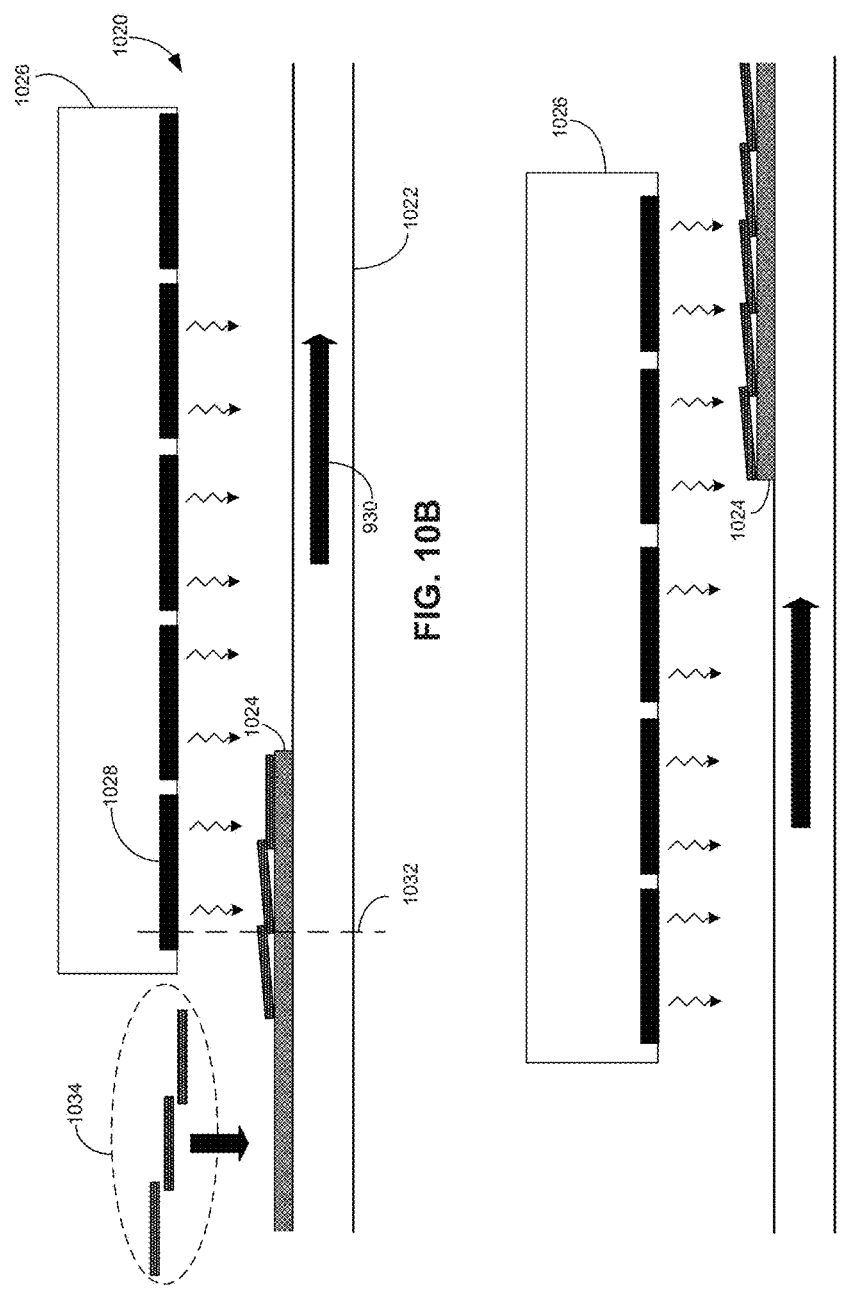

SYSTEM AND METHOD FOR CURING CONDUCTIVE PASTE USING INDUCTION HEATING

FIELD OF THE INVENTION

This generally relates to the fabrication of photovoltaic structures. More specifically, this disclosure is related to system and method for curing conductive paste used for electrical and mechanical coupling between cascaded photovoltaic strips.

Definitions

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of strips may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a "string."

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Advances in photovoltaic technology, which is used to make solar panels, have helped solar energy gain mass appeal among those wishing to reduce their carbon footprint and decrease their monthly energy costs. However, the panels are typically fabricated manually, which is a time-consuming and error-prone process. This makes it costly to mass-produce reliable solar panels.

Solar panels typically include one or more strings of complete solar cells. Adjacent solar cells in a string may overlap one another in a cascading arrangement. For example, continuous strings of solar cells that form a solar panel are described in U.S. patent application Ser. No. 14/511,008, filed Oct. 8, 2014, and entitled "Module Fabrication of Solar Cells with Low Resistivity Electrodes," the disclosure of which is incorporated herein by reference in its entirety. Producing solar panels with a cascaded cell arrangement can reduce the resistance due to interconnections between the strips, and can increase the number of solar cells that can fit into a solar panel.

Fabrications of such cascaded panels can involve overlapping edges of adjacent cells in such a way that the electrodes (busbars) on opposite sides of the overlapped cells are in contact to establish an electrical connection. This process is repeated for a number of successive cells until one string of cascaded cells is created. A number of strings are then coupled to each other (either in series or in parallel) and placed in a protective frame. To further reduce internal resistance of the entire panel and to ensure that the manufactured panel is compatible with conventional panels, one form of the cascaded panel (as described in the aforementioned patent application) can include a series of solar cell strips created by dividing complete solar cells into smaller pieces (i.e., the strips). These smaller strips can then be cascaded (edge-overlapped) to form a string. Conductive paste can be applied on the busbars to provide mechanical bonding and electrical coupling between the overlapping busbars of adjacent strips.

SUMMARY

A system for curing conductive paste applied on photovoltaic structures can be provided. The system can include a wafer carrier and an induction heater. The wafer carrier can carry a plurality of photovoltaic structures and can include a surface element that is in direct contact with the photovoltaic structures. The induction heater can be positioned above the wafer carrier and can include an induction coil that does not directly contact the photovoltaic structures.

In some embodiments, the surface element can be made of polybenzimidazole (PBI) plastic.

In further embodiments, a surface of the surface element can be patterned such that only a fraction of the surface is in contact with the photovoltaic structures.

In some embodiments, the surface element can include a number of components separated by air gaps to allow an individual component to expand when heated.

In some embodiments, the induced temperature of the conductive paste can be kept between 150 and 300° C.

In some embodiments, the induction heater can include a core housing element and a power supply providing an alternating current to the induction coil.

In further embodiments, the induction heater can further include a non-conductive, heat resistant, low magnetic permeability cooling enclosure enclosing the housing element and the induction coil.

In further embodiments, the induction coil can be made of a material having a thermal conductivity between 350 and 450 W/(m·k) and an electrical conductivity between 59 and $65 \times 10^{6}$ S·m.

In some embodiments, the core housing can be made of a material having a magnetic permeability between 0.001 and 1.0 H/m.

In some embodiments, the wafer carrier can be positioned approximately 0.1 to 4 millimeters from the conductive paste.

BRIEF DESCRIPTION OF THE FIGURES

FIG. 10A shows an exemplary inline thermal curing system, according to an embodiment of the present invention.

FIG. 10B shows an exemplary inline thermal curing system, according to an embodiment of the present invention.

FIG. 10C shows the end of a wafer carrier moving out of the heated region below the induction heater, according to an embodiment of the present invention.

In the figures, like reference numerals refer to the same figure elements.

DETAILED DESCRIPTION

Figure 1A:
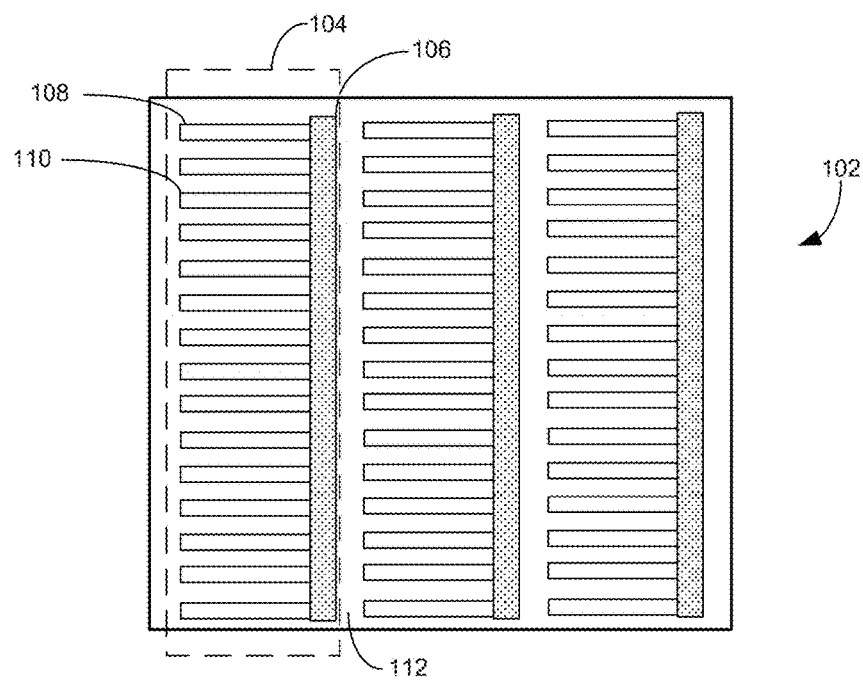
FIG. 1A shows an exemplary grid pattern on the front surface of a photovoltaic structure.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention can provide a system and method for thermally curing, using induction techniques, conductive paste used for bonding edge-overlapping solar cell strips. More specifically, the system can include an induction heater and a wafer carrier. The induction heater can include an induction coil that can produce a changing magnetic field. This changing magnetic field can then induce a varying current within the conductive paste binding solar strips, causing the conductive paste sandwiched between overlapping busbars to be heated and cured. The current-induced heat can be localized in the conductive paste. As a result, it is optional to use a heat-resistant wafer carrier. In some embodiments, at least a portion of the wafer carrier can be made of polybenzimidazole (PBI) plastic. The very low thermal conductivity of the PBI plastic can further insulate the heat generated in the conductive paste, although such additional thermal insulation might not be necessary.

Solar Panel Based on Cascaded Strips

As described in U.S. patent application Ser. No. 14/563,867, a solar panel can have multiple (e.g., three) strings, each string including cascaded strips, connected in parallel. Such a multiple-parallel-string panel configuration provides the same output voltage with a reduced internal resistance. In general, a cell can be divided into $n_1$ strips, and a panel can contain $n_2$ strings. The numbers $n_1$ and $n_2$ can be the same or different. The number of strips in a string can be a few more than, a few less than, or the same as the number of regular photovoltaic structures in a conventional single-string panel. Such a configuration can ensure that each string outputs approximately the same voltage as a conventional panel. The $n_2$ strings can then be connected in parallel to form a panel. As a result, the panel's voltage output can be the same as that of the conventional single-string panel, while the panel's total internal resistance can be $1/n_2$ of the resistance of a string. Therefore, in general, a greater $n_2$ can lead to a lower total internal resistance and, hence, more power extracted from the panel. However, a tradeoff is that as $n_2$ increases, the number of connections required to interconnect the strings also increases, which increases the amount of contact resistance. Also, the greater $n_1$ is, the more strips a single cell needs to be divided into, which increases the associated production cost and decreases overall reliability due to the larger number of strips used in a single panel.

Another consideration in determining $n_1$ is the contact resistance between the electrode and the photovoltaic structure on which the electrode is formed. The type of electrode can dictate the number of strips. For example, conventional silver-paste or aluminum-based electrodes typically cannot produce an ideal resistance between the electrode and underlying photovoltaic structure. As a result, such electrodes may require $n_1$ to be smaller, rather than larger. This is because, as $n_1$ increases, the number of inter-strip connections also increases, which leads to increased internal series resistance of each string, and therefore an overall increased internal resistance of the entire panel. In addition, the greater $n_1$ is, the more difficult the fabrication process is. In some embodiments of the present invention, the electrodes, including both the busbars and finger lines, can be fabricated using a combination of physical vapor deposition (PVD) and electroplating of copper as an electrode material. The resulting copper electrode can exhibit lower resistance than an aluminum or screen-printed-silver-paste electrode. Consequently, a smaller $n_1$ can be used to attain the benefit of reduced contact resistance per strip without incurring too much resistance caused by inter-strip connections. In some embodiments, $n_1$ can be selected to be three, which is less than the $n_1$ value generally needed for cells with silver-paste electrodes or other types of electrodes. Correspondingly, two grooves can be scribed on a single cell to allow the cell to be divided into three strips.

In addition to lower contact resistance, electroplated copper electrodes can also offer better tolerance to microcracks, which may occur during a cleaving process. Such microcracks might adversely impact silver-paste-electrode cells. Plated-copper electrodes, on the other hand, can preserve the conductivity across the cell surface even if there are microcracks in the photovoltaic structure. The copper electrode's higher tolerance for microcracks can allow one to use thinner silicon wafers to manufacture cells. As a result, the grooves to be scribed on a cell can be shallower than the grooves scribed on a thicker wafer, which in turn can help increase the throughput of the scribing process. More details on using copper plating to form low-resistance electrodes on a photovoltaic structure are provided in U.S. patent application Ser. No. 13/220,532, entitled "SOLAR CELL WITH ELECTROPLATED GRID," filed Aug. 29, 2011, the disclosure of which is incorporated herein by reference in its entirety.

FIG. 1A shows an exemplary grid pattern on the front surface of a photovoltaic structure. In the example shown in FIG. 1A, grid 112 can include three sub-grids, such as sub-grid 114. This three sub-grid configuration can allow the photovoltaic structure to be divided into three strips. To enable cascading, each sub-grid can have an edge busbar, which can be located either at or near the edge. In the example shown in FIG. 1A, each sub-grid can include an edge busbar ("edge" here refers to the edge of a respective strip) running along the longer edge of the corresponding strip and a plurality of parallel finger lines running in a direction parallel to the shorter edge of the strip. For example, sub-grid 114 can include edge busbar 116, and a plurality of finger lines, such as finger lines 118 and 111. To facilitate the subsequent laser-assisted scribe-and-cleave process, a predefined blank space (i.e., space not covered by electrodes) can be inserted between the adjacent sub-grids. For example, blank space 112 can be defined to separate sub-grid 114 from its adjacent sub-grid. In some embodiments, the width of the blank space, such as blank space 112, can be between 0.1 mm and 5 mm, preferably between 0.5 mm and 2 mm. There is a tradeoff between a wider space that leads to a more tolerant scribing operation and a narrower space that leads to more effective current collection. In a further embodiment, the width of such a blank space can be approximately 1 mm.

Figure 1B:
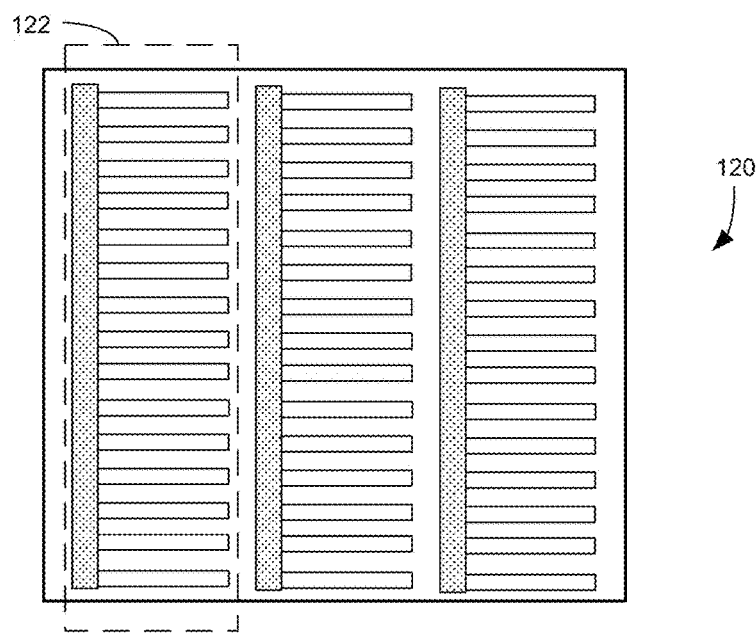
FIG. 1B shows an exemplary grid pattern on the back surface of a photovoltaic structure.

FIG. 1B shows an exemplary grid pattern on the back surface of a photovoltaic structure. When showing the back surface, for illustration purposes, the photovoltaic structure is assumed to be transparent. The grid patterns on the front and back surfaces of the photovoltaic structure are viewed from the same viewing point. In the example shown in FIG. 1B, back grid 120 can include three sub-grids, such as sub-grid 122. To enable cascaded and bifacial operation, the back sub-grid may correspond to the front sub-grid. More specifically, the back edge busbar can be located at the opposite edge of the frontside edge busbar. In the examples shown in FIGS. 1A and 1B, the front and back sub-grids can have similar patterns except that the front and back edge busbars are located adjacent to opposite edges of the strip. In addition, locations of the blank spaces in back conductive grid 120 can correspond to locations of the blank spaces in front conductive grid 112, such that the grid lines do not interfere with the subsequent scribe-and-cleave process. In practice, the finger line patterns on the front and back sides of the photovoltaic structure may be the same or different.

In the examples shown in FIGS. 1A and 1B, the finger line patterns can include continuous, non-broken loops. For example, as shown in FIG. 1A, finger lines 118 and 111 can both include connected loops. This type of "looped" finger line pattern can reduce the likelihood of the finger lines peeling away from the photovoltaic structure after long use. Optionally, the sections where parallel lines are joined can be wider than the rest of the finger lines to provide more durability and prevent peeling. Patterns other than the one shown in FIGS. 1A and 1B, such as un-looped straight lines or loops with different shapes, are also possible.

Figure 2A:
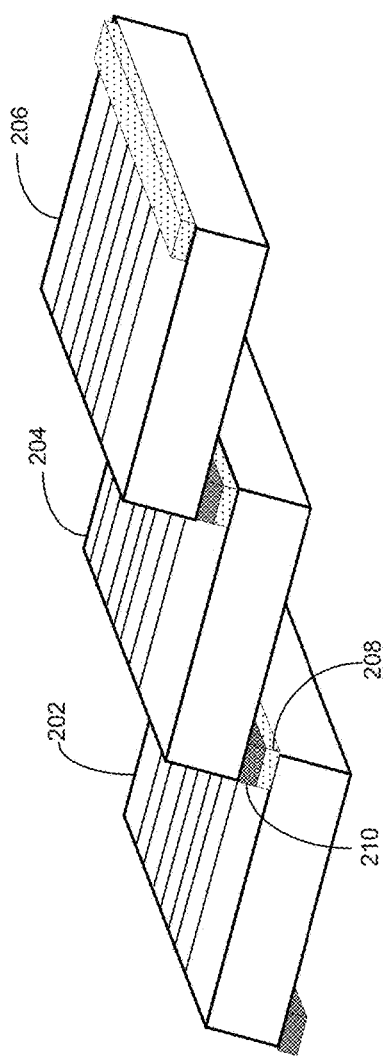
FIG. 2A shows a string of cascaded strips.

To form a cascaded string, cells or strips (e.g., as a result of a scribing-and-cleaving process applied to a regular square cell) can be cascaded with their edges overlapped. FIG. 2A shows a string of cascaded strips. In FIG. 2A, strips 202, 204, and 206 can be stacked in such a way that strip 206 can partially overlap adjacent strip 204, which can also partially overlap (on an opposite edge) strip 202. Such a string of strips can form a pattern that is similar to roof shingles. Each strip can include top and bottom edge busbars located at opposite edges of the top and bottom surfaces, respectively. Strips 202 and 204 may be coupled to each other via an edge busbar 208 located at the top surface of strip 202 and an edge busbar 211 located at the bottom surface of strip 204. To establish electrical coupling, strips 202 and 204 can be placed in such a way that bottom edge busbar 211 is placed on top of and in direct contact with top edge busbar 208.

Figure 2B:
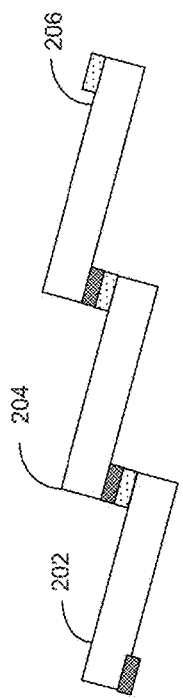
FIG. 2B shows a side view of the string of cascaded strips.

FIG. 2B shows a side view of the string of cascaded strips. In the example shown in FIGS. 2A and 2B, the strips can be part of a 6-inch square photovoltaic structure, with each strip having a dimension of approximately 2 inches by 6 inches. To reduce shading, the overlapping between adjacent strips should be kept as small as possible. In some embodiments, the single busbars (both at the top and the bottom surfaces) can be placed at the very edge of the strip (as shown in FIGS. 2A and 2B). The same cascaded pattern can extend along an entire row of strips to form a serially connected string.

Conductive Paste Curing System

When forming a photovoltaic panel, adjacent strips may be bonded together via edge busbars. Such bonding can be important to ensure that the electrical connections have high electrical conductivity and do not fail mechanically when the solar panel is put into service. One option for bonding the metallic busbars can include soldering. For example, the surface of the edge busbars may be coated with a thin layer of Sn. During a subsequent lamination process, heat and pressure can be applied to cure sealant material between photovoltaic structures and the front and back covers of the solar panel. The same heat and pressure can also solder together the edge busbars that are in contact, such as edge busbars 208 and 211. However, the rigid bonding between the soldered contacts may lead to cracking of the thin strips. Moreover, when in service solar panels often experience many temperature cycles, and the thermal mismatch between the metal and the semiconductor may create structural stress that can lead to fracturing.

To reduce the thermal or mechanical stress, it can be preferable to use a bonding mechanism that is sufficiently flexible and can withstand many temperature cycles. This can be achieved by bonding the strips using flexible adhesive that is electrically conductive. For example, adhesive (or paste) can be applied on the surface of top edge busbar 208 of strip 202 (shown in FIG. 2A). When strip 204 is placed to partially overlap with strip 202, bottom edge busbar 211 can be bonded to top edge busbar 208 by the adhesive, which can be cured at an elevated temperature. Different types of conductive adhesive or paste can be used to bond the busbars. In one embodiment, the conductive paste can include a conductive metallic core surrounded by a resin. When the paste is applied to a busbar, the metallic core establishes an electrical connection with the busbar while the resin that surrounds the metallic core functions as an adhesive. In another embodiment, the conductive adhesive may be in the form of a resin that includes a number of suspended conductive particles, such as Ag or Cu particles. The conductive particles may be coated with a protective layer. When the paste is thermally cured, the protective layer can evaporate to enable electrical conductivity between the conductive particles suspended inside the resin.

Figure 3A:
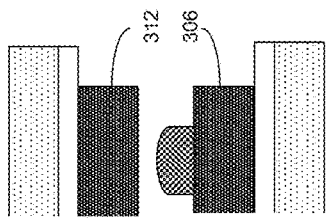
FIGS. 3A and 3B show the busbars and conductive paste before and after, respectively, the conductive paste is cured, according to an embodiment of the present invention.
Figure 3A:
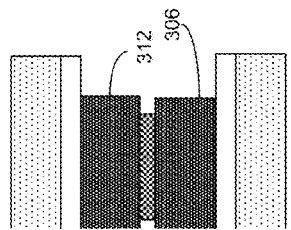
Figure 3A:
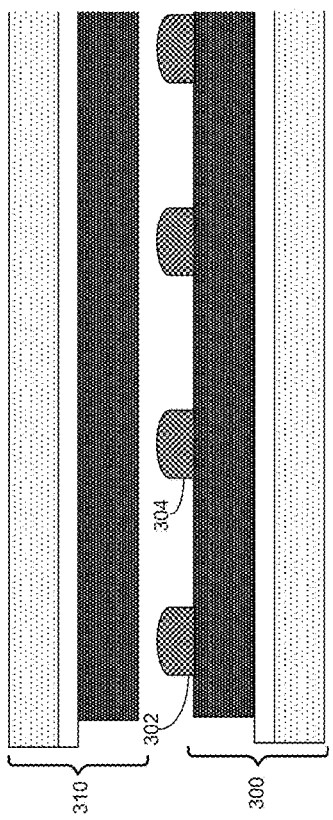
Figure 3B:
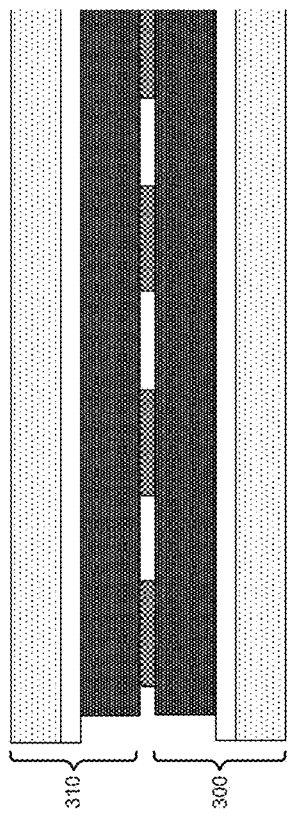

In some embodiments, the overlapping busbars can have the shape of a rectangular prism, and the conductive paste can be applied to the surface of at least one of the busbars. Once the conductive paste is cured under heat, the two overlapping busbars will be bonded to each other. FIGS. 3A and 3B show the busbars and conductive paste before and after, respectively, the conductive paste is cured, according to an embodiment of the present invention. More specifically, FIG. 3A shows that droplets of conductive paste (e.g., droplets 302 and 304) can be deposited on busbar 306, which is part of photovoltaic structure 300. FIG. 3B shows that photovoltaic structures 300 and 311 can be bonded to each other when busbar 312 overlaps with busbar 306 and the conductive paste droplets are cured.

Figure 4A:
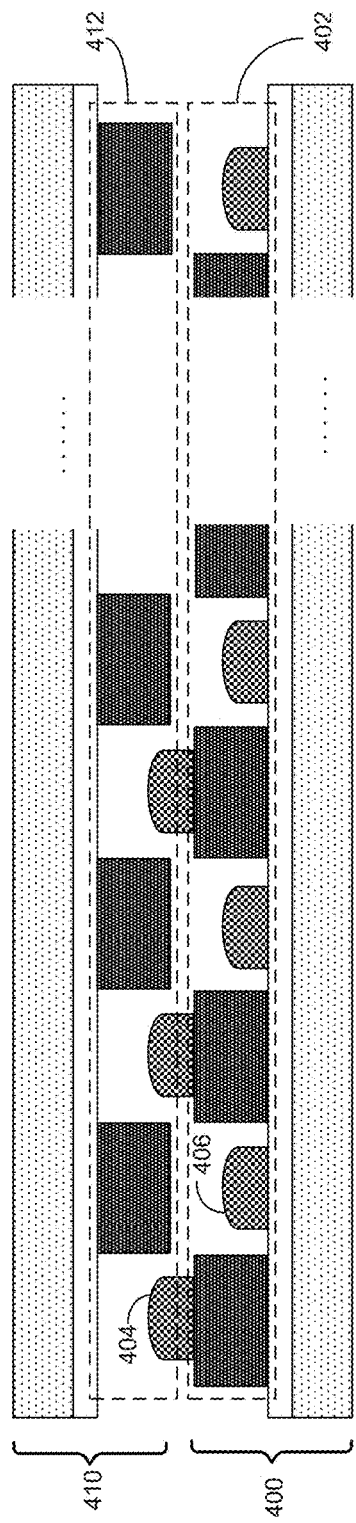
FIGS. 4A and 4B show the busbars and conductive paste before and after, respectively, the conductive paste is cured, according to an embodiment of the present invention.
Figure 4B:
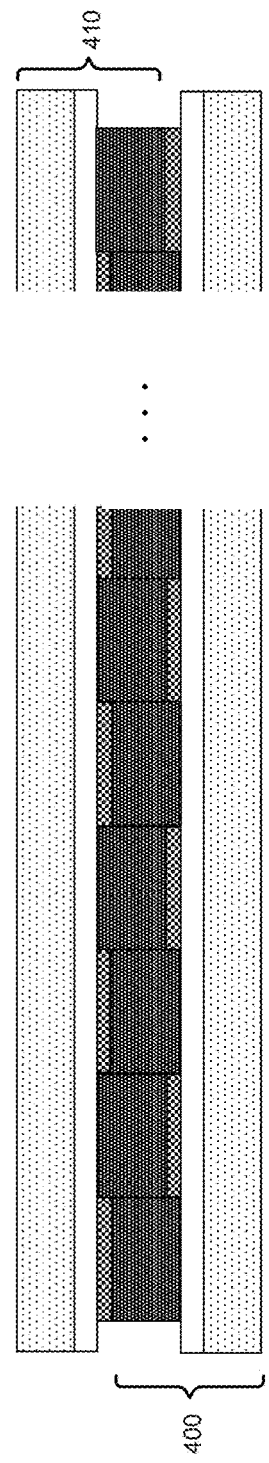

In some embodiments, the overlapping busbars can have complementary overlapping profiles and can interlock when stacked. FIGS. 4A and 4B show the busbars and conductive paste before and after, respectively, the conductive paste is cured, according to an embodiment of the present invention. FIG. 4A shows that segmented busbars 402 and 412 belonging to photovoltaic structure 400 and 411, respectively, have complementary topology profiles. Conductive paste droplets (e.g., droplets 404 and 406) can be applied on segments of busbar 402 and exposed surface of photovoltaic structure 400. FIG. 4B shows that photovoltaic structures 400 and 411 can be bonded to each other when busbars 402 and 412 interlock and the conductive paste droplets are cured. More specifically, segments of the busbar of one photovoltaic structure can be bonded via the cured paste to the exposed surface of the other photovoltaic structure.

Heat can be used to cure the conductive paste. In conventional approaches, cascaded strips (with paste applied and busbars overlapped) can be placed in a convection oven. However, the heating efficiency of such approaches is typically low as most of the heat may escape to the environment. For example, when the strips are placed inside a convection oven, a majority of the heat is used to heat up the air in the oven. In addition, air must be circulated to ensure that there is effective and even convection occurring on the strips. An uneven airflow can result in temperature non-uniformity on the strips. High airflows can cause the strips to shift position, resulting in incorrect string geometry. On the other hand, although low airflows do not shift the strips, they can lead to low heating efficiency, which not only wastes energy but can also lead to extended heating time. The longer heating time can reduce the throughput of the entire fabrication system. Moreover, long-time exposure of the photovoltaic structures to high temperatures can also damage the photovoltaic structures.

In another approach, cascaded strips can be placed one by one, or in groups, on a heating surface. While the strips are being placed on the surface, the surface must remain cooler than the temperature required for curing the paste; otherwise, the paste may cure prematurely, before all of the strips have been placed onto the surface. To circumvent this, one may keep the surface relatively cool, and only heat it up after all of the strips have been placed. Because these heating surfaces usually have large thermal masses, heating up and cooling down can take a long time, thus reducing the throughput of the fabrication system. In addition, heating and cooling of a large thermal mass can consume a large amount of energy, and can cause large thermal stresses to be applied to the tool.

Figure 5:
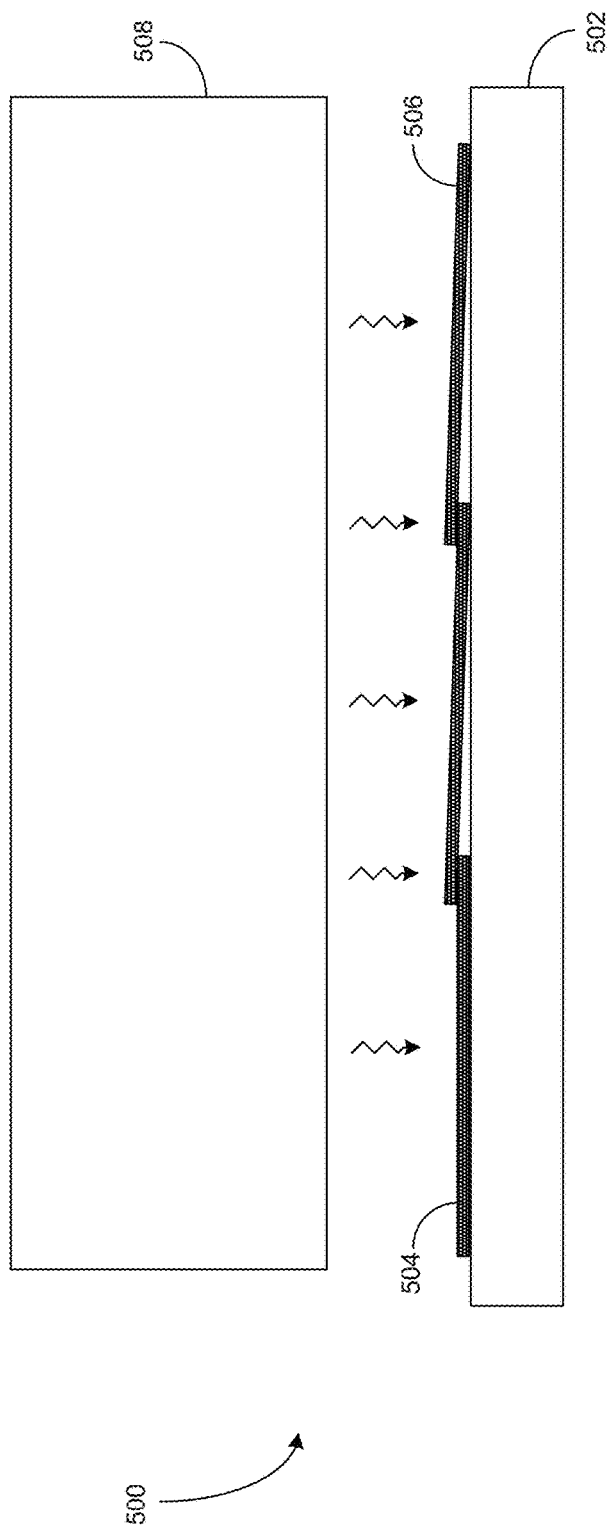
FIG. 5 shows an exemplary thermal curing system, according to an embodiment of the present invention.

To reduce the time needed for curing the conductive paste and to reduce energy usage, an induction heating system can be provided that can effectively localize the heat to cure the conductive paste. Such system can provide heat to the conductive paste using alternating magnetic field. The alternating magnetic field can produce electrical current in the conductive paste, which can produce localized heat in order to cure the conductive paste effectively. More specifically, the produced electrical current, also known as eddy current, in the conductive paste because of varying magnetic fields causing electron flow in the conductive paste, which in turn provides effective heating method for the conductive paste using Joules effect. FIG. 5 shows an exemplary induction curing system, according to an embodiment of the present invention. Thermal curing system 500 can include a wafer carrier 502 for carrying solar cell strips (e.g., strips 504 and 506) and an induction heater 508.

In some embodiments, induction heater 508 can be placed near the surface of the strips so that the alternating magnetic filed can induce eddy currents specifically at the overlapped edges of the strips. More specifically, induction heater 508 does not have direct physical contact with the solar cell strips since it can utilize the skin effect to heat the conductive paste from within. The skin effect is the tendency of an alternating electric current to become distributed within a conductor such that the current density is largest near the surface of the conductor, and decreases with greater depths in the conductor. The electric current flows mainly at the "skin" of the conductor, between the outer surface and a certain depth (called skin depth). The skin effect causes the effective resistance of the conductor to increase at higher frequencies where the skin depth is smaller, thus reducing the effective cross-section of the conductor. The skin effect is due to opposing eddy currents induced by the changing magnetic field resulting from the alternating current in induction heater 508. As the result, induction heater 508 can indirectly heat up the conductive paste sandwiched between the edge-overlapped strips. After being heated for a certain time period, the conductive paste can be cured, mechanically bonding the edge-overlapped strips to each other. Compared with direct-contact-based heating, this heating arrangement can provide higher throughput, improve efficiency, and prevent damage to the strips. Compared with convection-oven-based heating, this heating arrangement can provide better heating uniformity and higher throughput, and can significantly improve efficiency.

Figure 6A:
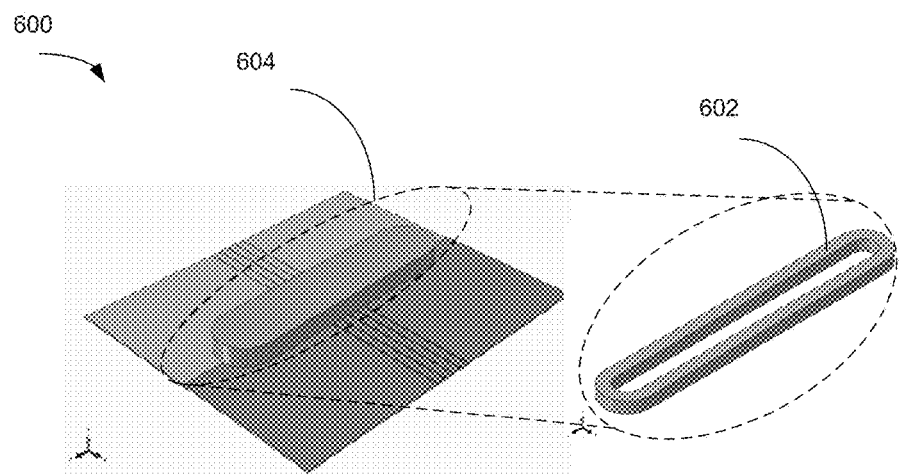
FIG. 6A shows the perspective view of the induction heater, according to an embodiment of the present invention.

FIG. 6A shows a detailed view of the induction heater, according to an embodiment of the present invention. Induction heater 600 can include coil 602, core 604, and a power source (not shown in the drawing). Coil 602 can be made of a material with high conductivity, including metallic materials (e.g., copper). In some embodiments, the electrical conductivity of coil 602 can range from 59 to $65 \times 10^6$ S/m, and the thermal conductivity of the material forming coil 602 can range from 350 to 450 W/(m·k). In the example shown in FIG. 6, coil 602 is stadium shaped, a rectangle with U-shaped ends. Other shapes can also be possible, such as cubical or cylindrical. The length of coil 602 can cover the overlapped photovoltaic strips and can range from few millimeters to several meters long depending on the length of the overlapped area of strips that needs to be heated. In some embodiments, the length of core 602 can be approximately 180 mm. In order to accurately target the overlapped region of the photovoltaic cells, the width, height, and/or distance between the longer sides of coil 602 can range from 2 to 11 mm, in accordance to some embodiments. Note that these dimensions can vary greatly based on the geometry of overlapped regions of photovoltaic strip, material used in photovoltaic structures, and required temperature for effective curing of the conductive paste being used.

Figure 6B:
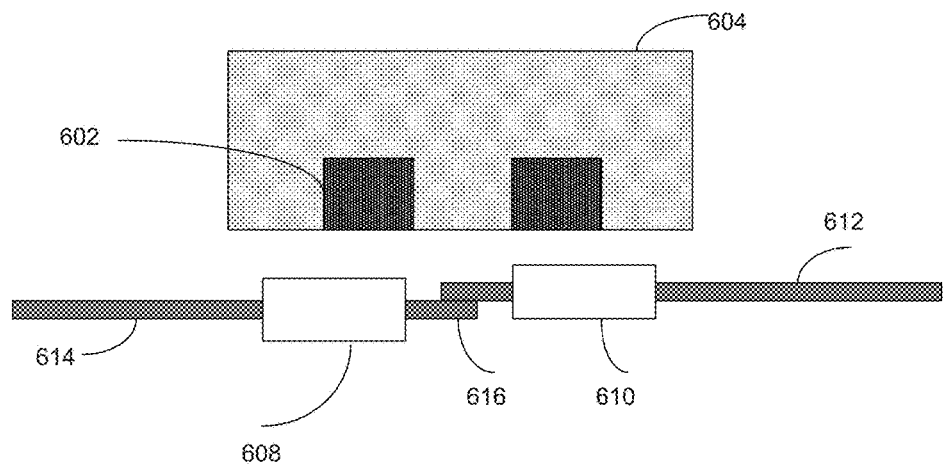
FIG. 6B shows the cross-sectional view of the induction heater, according to an embodiment of the present invention.

FIG. 6B shows a cross sectional view of the induction heater, according to an embodiment of the present invention. As shown in FIG. 6B, induction heater 600 can include core 604 enclosing coil 602 for more targeted and controlled heating of the conductive pates. In addition, core 604 would strengthen the magnetic field generated via coil 602 leading to more efficient heating of the conductive paste. In some embodiments, to facilitate increased magnetic flux, the magnetic permeability of core 604 can be 0.001-1.0 H/m. the electrical conductivity of core 604 can be approximately $11 \times 11^6$ S/m, and the thermal conductivity of the material forming core 604 can range from 30 to 80 W/(m·k). The size of core 604 can vary based on the selected size of coil being utilized. For example, the width and height of core 604 can range from a few millimeters to tens millimeters since core 604 can cover sides and top surfaces of coil 602 exposing only the bottom surface of coil 602 as shown in FIG. 6B.

As discussed previously, the varying magnetic fields is what causes an electromagnetic induction to work. To create the varying magnetic field, typically a high frequency alternating current (AC) passes to an electromagnet, namely coil 602. The energy that creates the magnetic field derived from the power source generating and passing AC current can be determined based on several factors including permeability, resistivity, size, shape, distance from coil, and penetration depth of conductive paste being cured. In some embodiments, AC current can range from 1 to 20 A/m while AC frequency can range from 1-300 KHz depending on above-mentioned considerations.

Figure 7A:
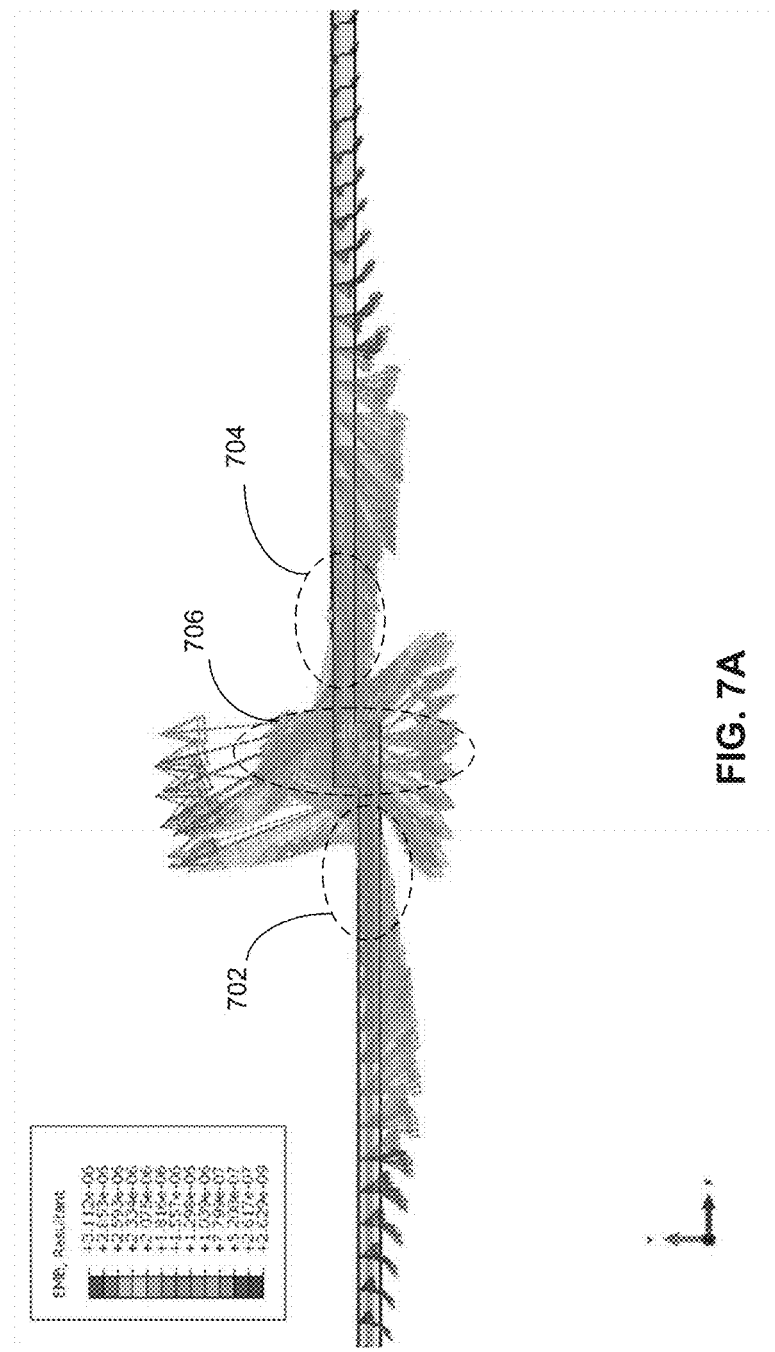
FIG. 7A shows the magnetic flux density at the surfaces of two cells within a photovoltaic string, according to an embodiment of the present invention.
Figure 7B:
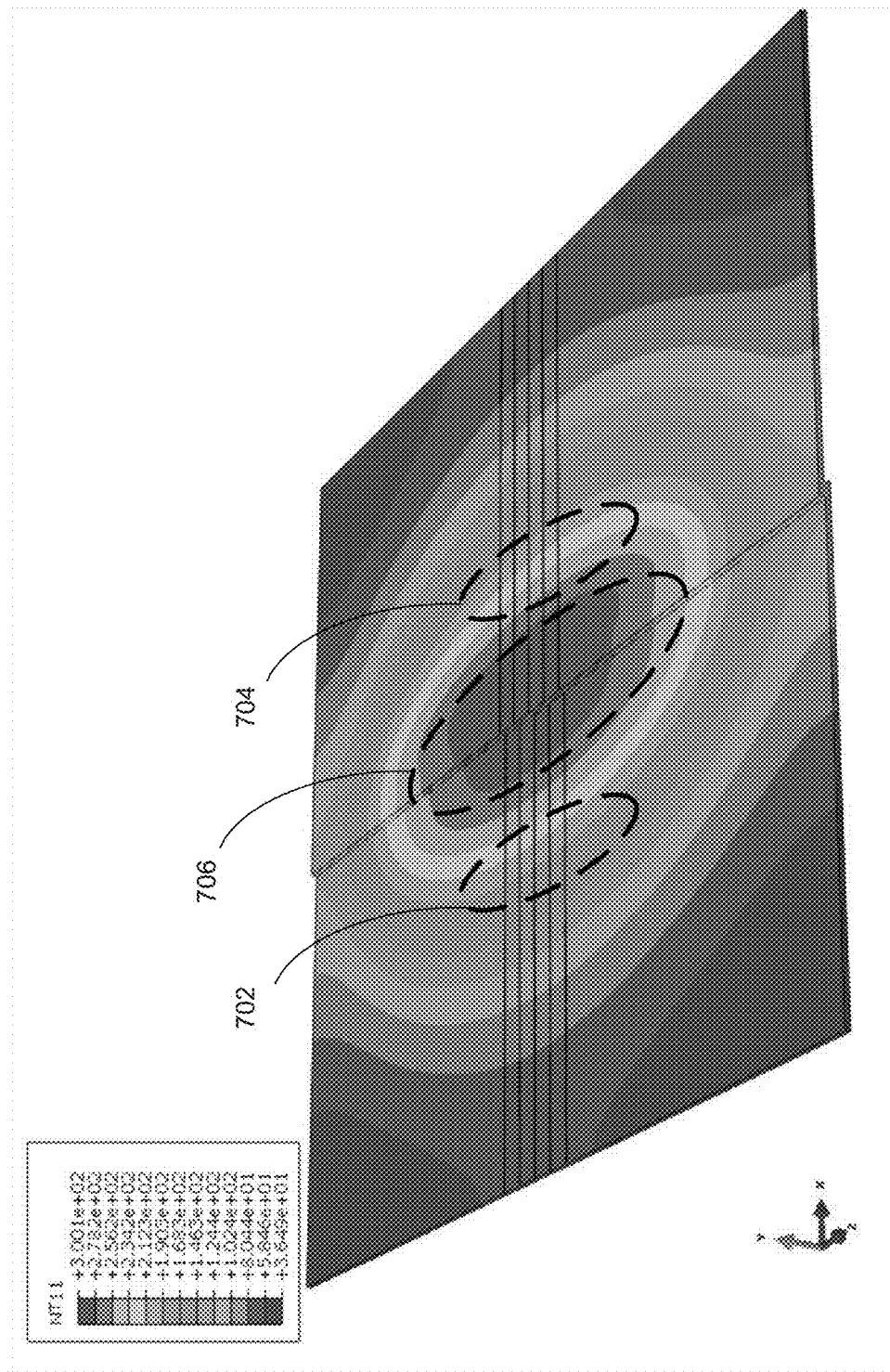
FIG. 7B shows the temperature gradient at the surfaces of two cells within a photovoltaic string, according to an embodiment of the present invention.

FIG. 7A shows magnetic flux density at the surfaces of two cells within a photovoltaic string, and FIG. 7B shows the temperature gradient at the surfaces of two cells within a photovoltaic string using upper bounds of current and frequency passed to the induction coil of the heater element. As can be seen in these figures, magnetic flux density and temperature region 706, which is the overlapped area between regions 702 and 704, can experience the highest amount of magnetic flux and hence the highest temperature. Magnetic field tunnel-shields can be used to improve the heat localization and reduce the risk of overheating and overstressing of the nearby areas.

As shown in FIG. 6B, magnetic field tunnel shields 608 and 610 can be used to protect portions of surface areas of cells 612 and 614 that are near the overlapped region 616. This way, the varying magnetic field cannot affect the metallization of the protected regions as the overlapped region 616 is targeted for curing the conductive paste on the photovoltaic structure. In some embodiments, the length of the area protected by the tunnel shields can be between 5 to 11 millimeters, while the height of the tunnel shields can be between 2-4 millimeters leaving an opening between the tunnel shields that can be between 0.5 to 4 millimeters.

Figure 7C:
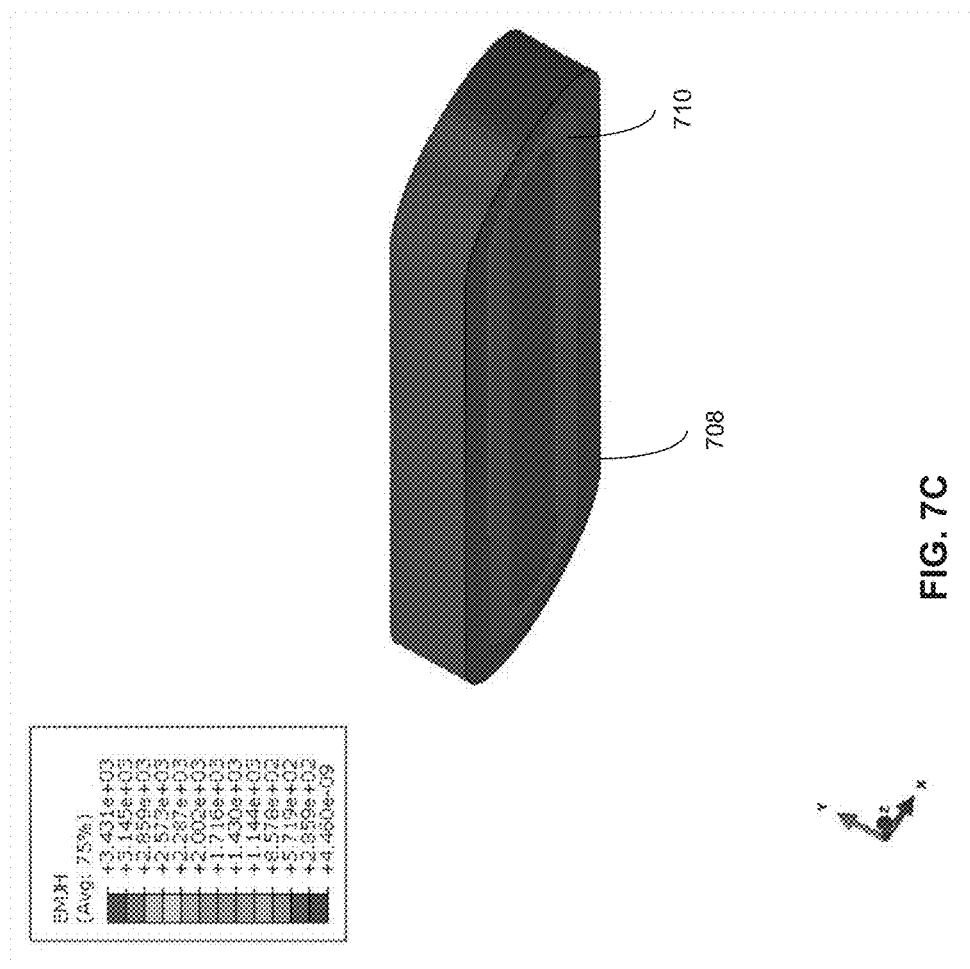
FIG. 7C shows the heat density (in terms of Joules) of an induction heater, according to an embodiment of the present invention.

FIG. 7C show a heat density gradient of induction coil 710 (in terms of Joules) in a perspective view of induction heater element 708, in accordance to some embodiments. Induction heater 708 heats the conductive paste sandwiched between the overlapped regions of two neighboring cells of the photovoltaic strip. As one can see, the induction coil 710 can experience a high temperature and may need to be cooled for ideal operation conditions. In some embodiments, the induction heater coil housed in the induction heater core can be enclosed in a non-conductive, heat resistant, and low magnetic permeability cooling enclosure for better temperature management of the induction coil and core housing. The enclosed induction coil and core housing can use one or more cooling methods, namely forced air or water cooling methods, for temperature management of the conductive paste curing system.

In conventional high-temperature settings, metallic or graphite wafer carriers are often used to support wafers due to their heat-resistant capability. However, although they are not easily damaged by heat, they are also good heat conductors. After being transferred from the radiation block to the strips located on the wafer carriers, a portion of the heat can escape via the wafer carrier due to its good heat conductivity. This can reduce the heating efficiency and, hence, can prolong the time needed for curing the paste. To overcome this problem, instead of metal or graphite, the wafer carrier can be made of a plastic or ceramic material that is heat-resistant and has low thermal conductivity.

Figure 8A:
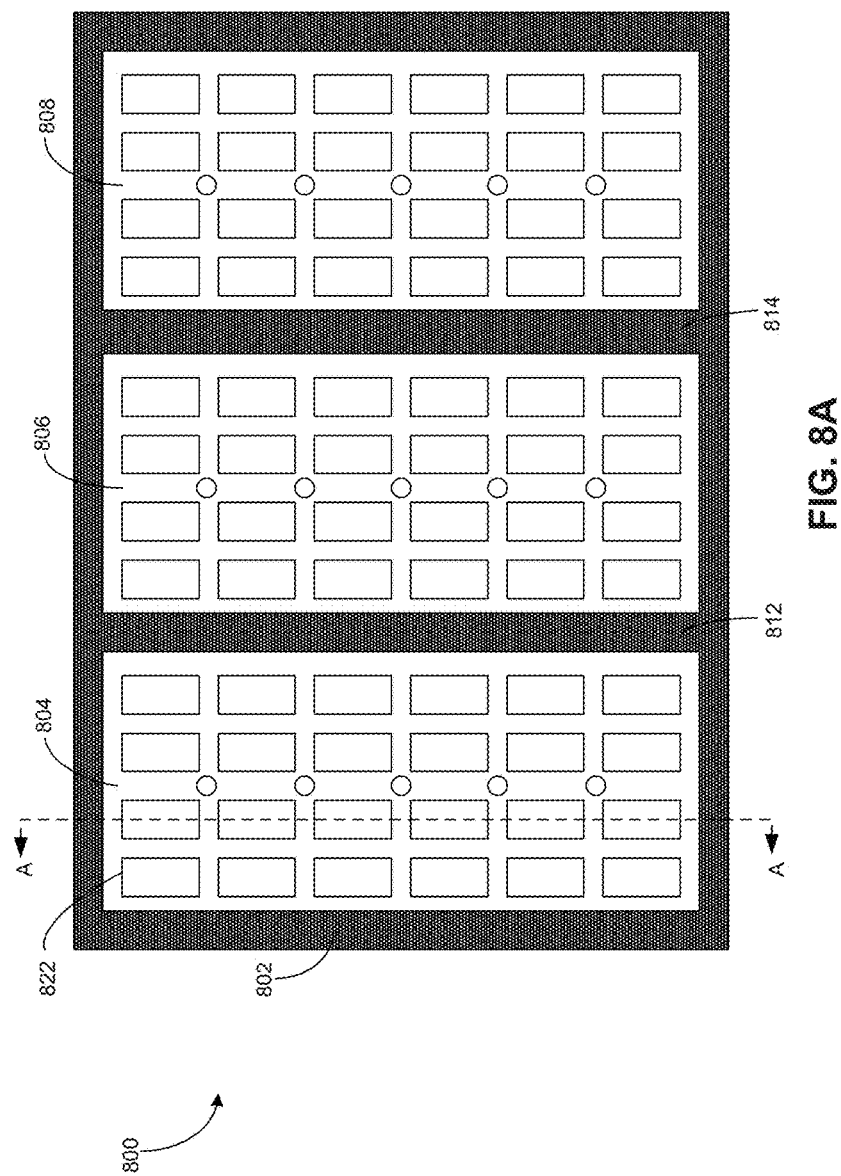
FIG. 8A shows the top view of a first exemplary wafer carrier, according to an embodiment of the present invention.

FIG. 8A shows the top view of a first exemplary wafer carrier, according to an embodiment of the present invention. Wafer carrier 800 can include a base 802 and a number of strip carriers, such as strip carriers 804, 806, and 808. Base 802 is not in contact with the photovoltaic structures and can be made of materials with good thermal conductivity, such as metal. In one embodiment, base 802 can be made of stainless steel. The base of wafer carrier 800 can be used to couple wafer carrier 800 to a conveyor system, which can transport the photovoltaic structures from one processing station to the next.

The strip carriers can be configured to carry the strips that are precisely aligned such that the busbars of adjacent strips overlap with conductive paste sandwiched in between. A robotic system with the assistance of a vision system can be used to place and align the strips. A detailed description of the robotic system and the vision system can be found in U.S. patent application Ser. No. 14/866,766, entitled "SYSTEMS AND METHODS FOR CASCADING PHOTOVOLTAIC STRUCTURES," filed Sep. 25, 2015, the disclosure of which is incorporated herein by reference in its entirety.

Note that because the induction system can generate highly localized and rapid heating, the heat loss from the heated region can be well controlled. As a result, the requirement for the heat resistance of the wafer carrier becomes less critical. In some embodiments, it is possible that the curing of the conductive paste can be completed long before the heat can be transferred to the surface of the paste. It can then be optional to use heat-resistant material for the wafer carrier. Nevertheless, to further reduce any possible heat loss, the strip carriers can be made of a plastic material that is heat-resistant and has low thermal conductivity. In some embodiments, the strip carriers can be made of polybenzimidazole (PBI) plastic. Compared with other plastic materials, PBI plastic can provide a number of superior thermal properties, including high thermal resistance and low thermal expansion coefficient. In addition, PBI plastic can also provide superior mechanical properties over other insulating materials, making it an ideal candidate for forming the strip carriers.

Figure 8B:
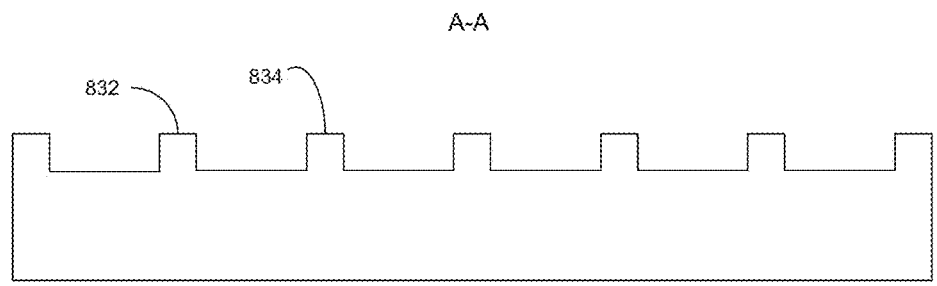
FIG. 8B shows the cross-sectional view of a strip carrier along cut plane A-A, according to an embodiment of the present invention.

In addition to choosing a material with low thermal conductivity to form the strip carriers, in some embodiments, the geometry of the strip carries is also carefully designed to further reduce the heat loss. In the example shown in FIG. 8A, the surface of the strip carriers can be patterned. More specifically, each rectangle (e.g., rectangle 822) on a strip carrier indicates a raised boss. FIG. 8B shows the cross-sectional view of a strip carrier along cut plane A-A, according to an embodiment of the present invention. When a strip is placed on the strip carrier, only the ridges (e.g., ridges 832 and 834) are in contact with the strip. This way, instead of having the entire back surface of the strips in contact with the strip carriers, only a portion of the back surface of the strips is in contact with the strip carrier. In some embodiments, the total size of the top surface of the ridges can be between 11 and 30% the size of a strip carrier. The reduced contact area can reduce the amount of heat being transferred from the strips to the strip carriers. In addition to the pattern shown in FIG. 8A, other patterns are also possible. For example, instead of rectangular, shapes of the indentations can include square, triangular, circular, half circular, oval, or any other regular or irregular shapes.

In some embodiments, the strip carriers can be designed in such a way that each strip carrier can support and carry a single strip. For example, strip carrier 804 can support one strip, and strip carrier 806 can support an adjacent strip. The size of the strip carriers can be defined based on the size of the strip. More specifically, each strip carrier can be designed to be smaller than the strip to allow a gap to exist between two adjacent strip carriers. For strips that were obtained by dividing standard six-inch square wafers, the length of the strip can be roughly six inches, whereas the width of each strip can be less than two inches (e.g., between 1.5 and 1.7 inches).

As shown in FIG. 8A, gap 812 can exist between strip carriers 804 and 806, and gap 814 can exist between strip carriers 806 and 808. Inserting a gap between adjacent strip carriers can be important, because the heat generated by the eddy currents in the conductive paste can be transferred to strip carriers causing them to expand under high temperature. Note that, although the thermal expansion coefficient of PBI plastic is very low, it can still be higher than that of the stainless steel base. Hence, to prevent bowing, it can be desirable to allow the strip carriers to expand. In the design shown in FIG. 8A, instead of having a continuous strip carrier carry multiple strips, separate strip carriers with gaps in between are used to carry the multiple strips. The width of the gap can be between 2 and 11 mm, preferably between 5 and 8 mm.

Figure 8C:
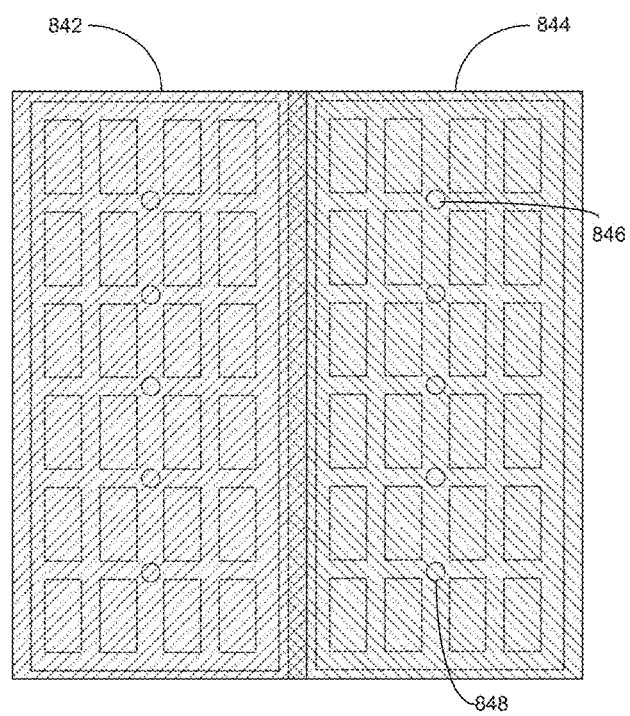
FIG. 8C shows an exemplary placement of two adjacent strips on the strip carriers, according to an embodiment of the present invention.

The way the strips are placed on wafer carrier 800 can also play an important role in the curing process. FIG. 8C shows an exemplary placement of two adjacent strips on the strip carriers, according to an embodiment of the present invention. Strips 842 and 844, shown in different hatch patterns, are placed adjacent to each other. For illustration purposes, in FIG. 8C, strips 842 and 844 are shown as transparent to reveal the strip carriers beneath. To maintain the position of the strips, each strip carrier can include a number of vacuum-holding holes, such as holes 846 and 848.

In the example shown in FIG. 8C, the right edge of strip 842 overlaps with the left edge of strip 844. This can result in the overlapping of the corresponding busbars (not shown in the drawing) of strips 842 and 844. In some embodiments, strips 842 and 844 can be placed in such a way that their overlapping edges (the crosshatched region shown in FIG. 8C) are positioned above the gap between the two adjacent strip carriers. In other words, the edges are not supported by the strip carriers directly. Compared with other arrangements, such as having the overlapping edges on top of a strip carrier, this arrangement can be beneficial to the curing of the conductive paste. Both strips are pulled down against the strip carrier by means of vacuum. In the overlapped region, the edge that is on the bottom will deflect slightly downwards, while the edge that is on the top will deflect slightly upwards, because they are trying to occupy the same space. This allows both edges to be locally parallel to each other, forming the best geometry for bonding. If the overlapped region were directly supported by the strip carrier, the bottom edge would be flat, while only the top edge would deflect upwards. The two edges would no longer be parallel but form an angle, which is not the ideal bonding geometry. The conductive paste typically can cure better when it is heated under pressure.

Figure 9A:
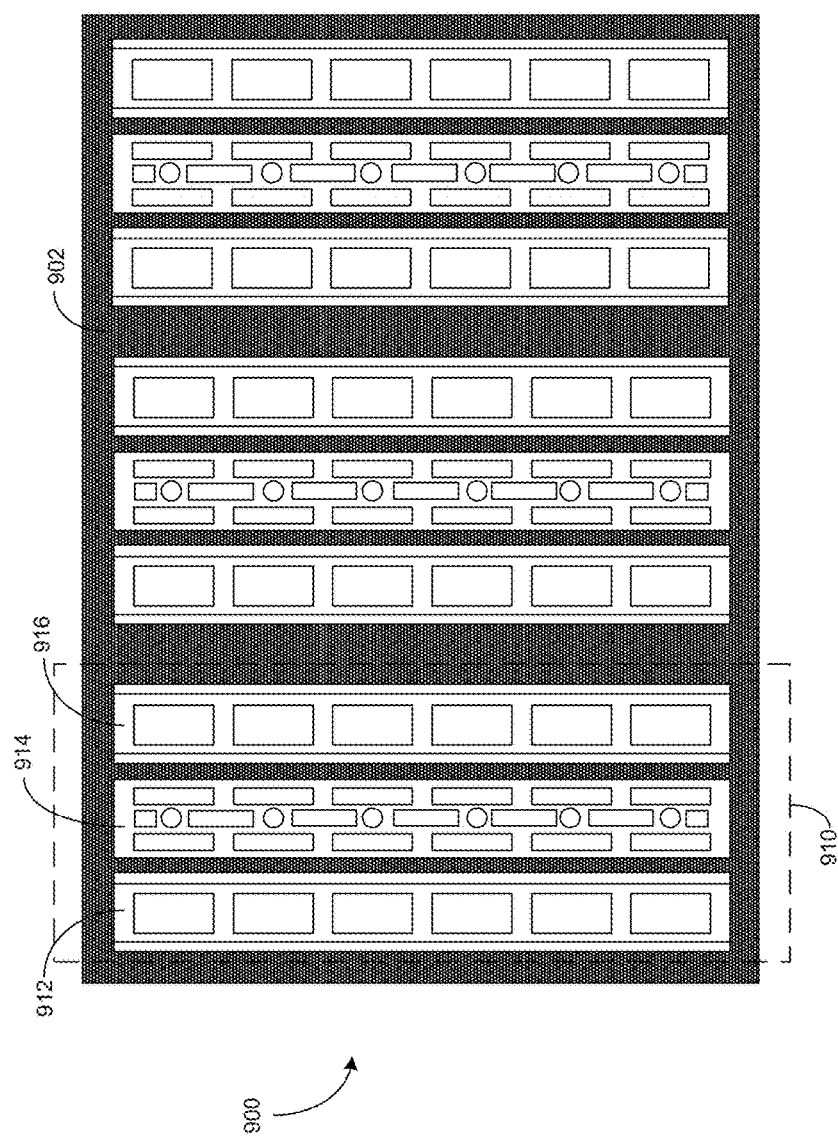
FIG. 9A shows the top view of a second exemplary wafer carrier, according to an embodiment of the present invention.

In addition to the example shown in FIG. 8A, the wafer carrier can have other forms. FIG. 9A shows the top view of a second exemplary wafer carrier, according to an embodiment of the present invention. Wafer carrier 900 can include a base 902 and a number of strip carriers, each of which can be designed to carry a single strip. Unlike the strip carriers shown in FIG. 8A, in FIG. 9A, each strip carrier can include multiple separate plastic pieces. For example, strip carrier 910 can include plastic pieces 912, 914, and 916. Using smaller pieces of plastic to construct the strip carrier can reduce material cost. More specifically, this can allow different plastic materials to be used to form a strip carrier. In the example shown in FIG. 9A, the center piece of a strip carrier can be made of PBI plastic, whereas the two side pieces can be made of a different plastic material, which can have less ideal thermal properties but can cost less than the PBI. Similar to what's shown in FIG. 8A, the rectangles in each plastic piece indicate indentations, and the circles indicate vacuum-holding holes. To match the thermal conductivity of the side pieces to that of the center piece, one can pattern the side pieces in such a way that a smaller portion of a side piece is in direct contact with the back surface of the strip.

Figure 9B:
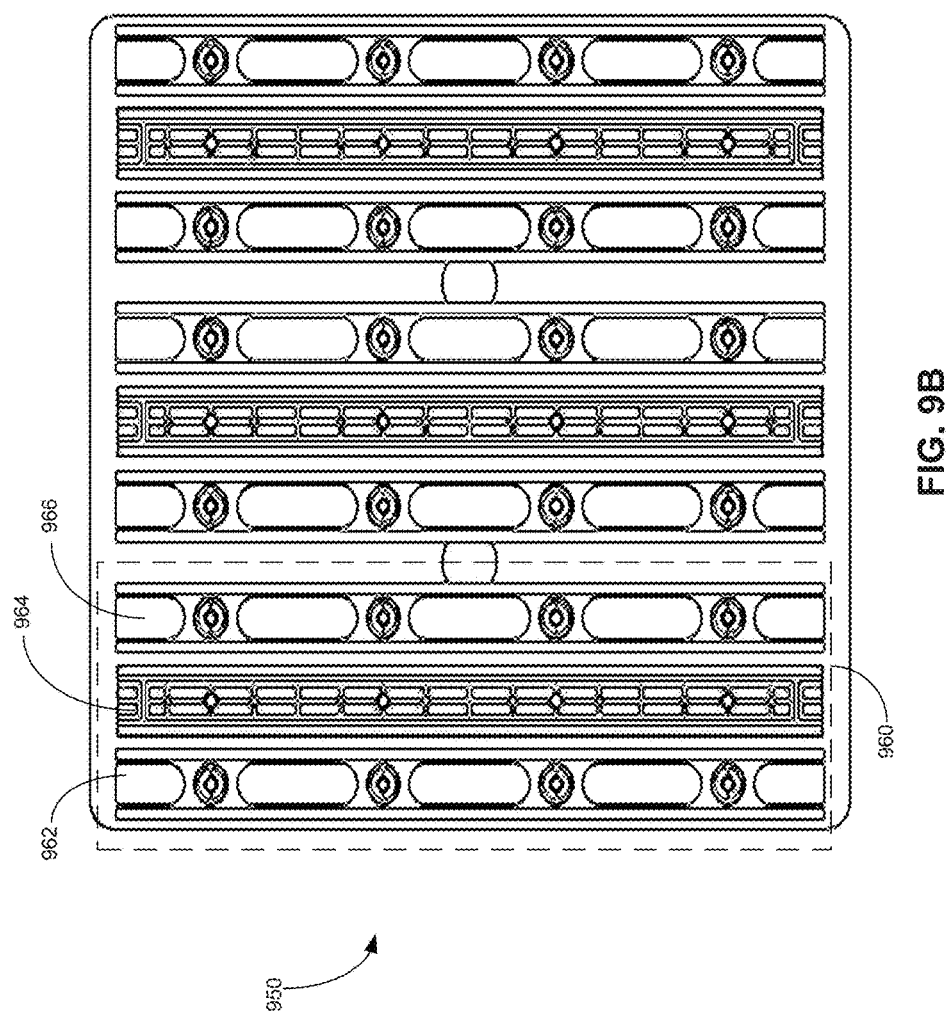
FIG. 9B shows the top view of a third exemplary wafer carrier, according to an embodiment of the present invention.

FIG. 9B shows the top view of a third exemplary wafer carrier, according to an embodiment of the present invention. Wafer carrier 950 can be similar to wafer carrier 900, and can include three strip carriers, with each strip carrier including three separate plastic pieces. For example, strip carrier 960 can include side pieces 962 and 966 and center PBI piece 964. Center piece 964 can include the vacuum-holding holes for holding down the strip. In the example shown in FIG. 9B, each plastic piece of a strip carrier can be approximately six inches long and approximately 0.5 inch wide. The gap between the plastic pieces within the same strip carrier can be approximately 0.1 inch.

Returning to FIG. 5, in this example, the thermal curing system includes one induction heater and one wafer carrier, both of which can remain stationary during the curing process. The distance between the induction coil of the induction heater and the strips on the wafer carrier can be kept between 0.1 and 4 mm. In addition, a very short heating time may cause the conductive paste to be heated unevenly. In some embodiments, the temperature induced by the induction heater to cure the conductive paste can be maintained at approximately 150-300° C., preferably at approximately 300° C., and the wafer carrier can be made of PBI plastic. In such scenarios, the conductive paste can be cured in approximately 6 seconds. In other words, the overlapping strips can be bonded after being placed under the induction heater for approximately 6 seconds. If the strips are removed before the required time for curing, the paste may not be sufficiently cured, which can result in poor bonding quality. On the other hand, keeping the strips under the induction heater longer can reduce the overall system throughput and can potentially damage the strips. A well-designed system that can efficiently heat the strips without damaging the photovoltaic junctions can reduce the time needed for curing the conductive paste to a period between 2 and 6 seconds.

For large-scale manufacturing, to increase throughput, an inline thermal curing system can be used. In an inline curing system, the wafer carrier along with the strips can be placed on a conveyor system and move under multiple induction heaters. FIG. 10A shows an exemplary inline thermal curing system, according to an embodiment of the present invention. Inline thermal curing system 1000 can include conveyor system 1002, which carries wafer carrier 1004, and a number of induction heaters, such as induction heaters 1012, 1014, 1016, and 1018. A number of photovoltaic strips can be held on the surface of wafer carrier 1004 by a vacuum-holding mechanism. The surface of wafer carrier 1004 can be made of PBI plastic, which is a good heat insulator. The strips have been aligned to each other such that their corresponding edge busbars overlap. Sandwiched between the overlapping busbars is the to-be-cured conductive paste. During operation, conveyor system 1002 can first move wafer carrier 1004 under any selected heater and then remain stationary to allow wafer carrier 1004 to stay the selected heater for a predetermined time. For example, wafer carrier 1004 can stay under induction heater 1012 for approximately 6 seconds, which can be sufficient to cure the conductive paste, given that each induction heater can induce enough heat for the conductive paste to reach temperature of approximately 300° C.

Note that having multiple induction coils in multiple induction heaters can cause frequency cross talk, which would be undesirable as each frequency is precisely determined for perfect surface penetration. In most cases, providing sufficient spacing can mitigate and/or eliminate this concern. However, in some embodiment, neighboring induction coils that may not have sufficient space from each other can be isolated using a magnetic shield or a special screen filtering unwanted frequency cross talk.

The implementation of conveyor system 1002 can make it possible for parallel curing of multiple groups of strips. More specifically, when wafer carrier 1004 is moved from induction heater 1012 to induction heater 1014, a different wafer carrier carrying a different group of strips can be positioned under induction heater 1012, and both groups of strips can be then heated simultaneously. This process can repeat with conveyor system 1002 simultaneously moving multiple groups of strips under the multiple induction heaters, increasing the system throughput fourfold.

FIG. 10B shows an exemplary inline thermal curing system, according to an embodiment of the present invention. In FIG. 10B, inline thermal curing system 1020 can include conveyor system 1022, which carries wafer carrier 1024, and extended induction heater 1026. Extended induction heater 1026 can be much larger in size than individual induction heaters 1012-1018 shown in FIG. 10A, thus allowing many more strips to be heated simultaneously. The coil within extended induction heater 1026 can be much longer (e.g., several meters) to cover multiple overlapped area within the photovoltaic strip.

During fabrication, wafer carrier 1024 can start from a location outside of the area below extended induction heater 1026. In the example shown in FIG. 10B, wafer carrier 1024 can start from a location to the left of extended induction heater 1026. A robotic arm (not shown in FIG. 10B) can pick up a set of photovoltaic strips and place the strips on wafer carrier 1024. The strips can be arranged in such a way that adjacent strips overlap at the edge. In some embodiments, the robotic arm can pick up and arrange three strips each time. Once a set of strips is placed on wafer carrier 1024, conveyor system 1022 can move wafer carrier 1024 to place the front portion of wafer carrier 1024 under extended induction heater 1026, as shown in FIG. 10B. In some embodiments, conveyor system 1022 can continue to move until the last overlapping edge of the set of strips is under extended induction heater 1026, as indicated by dashed line 1032. Conveyor system 1022 can then pause for a predetermined time (e.g., between 1 to 2 seconds) to allow the set of strips and, thus, conductive paste sandwiched between the overlapping edges to be heated by extended induction heater 1026.

While conveyor system 1022 remains stationary, the robotic arm can lay another set of strips (e.g., strip set 1034) onto wafer carrier 1024. The new set of strips can be arranged to be edge-overlapped with the set of strips that was already on wafer carrier 1024 to form a longer string. After conveyor system 1022 has remained stationary for the predetermined time, conveyor system 1022 can move forward again to place the newly laid set of strips under extended induction heater 1026 for heating. This process can repeat itself until a desired number of strips has been laid onto wafer carrier 1024 and has moved through extended induction heater 1026. The total amount of time that a set of strips remains under extended induction heater 1026 (i.e., the total amount of heating time) can be determined based on the temperature setting of extended induction heater 1026. For example, if the temperature induced by extended induction heater 1026 is set to be at approximately 300° C., the total amount of time used to move a set of strips from one end of extended induction heater 1026 to the other end of extended induction heater 1026 can be roughly 6 seconds. Considering that conveyor system 1022 may pause multiple times during the duration within which a particular set of strips remains under extended induction heater 1026, the time duration for each pause can be determined based on the total heating time and the number of pauses. For example, if it takes conveyor system 1022 four pauses in order to move a particular set of strips from one end of extended induction heater 1026 to the other end, each pause may last for approximately 1.5 seconds.

FIG. 10C shows the end of a wafer carrier moving out of the heated region below the induction heater, according to an embodiment of the present invention. Once all strips for a string have been moved out of the heated region under the extended induction heater, meaning that the conductive paste has been cured to mechanically bond the strips together, the entire string can be removed from the wafer carrier. In some embodiments, a robotic arm can pick up the string and transfer it to the next processing station (e.g., the panel assembly station). Moreover, the extended induction heater can move up to be further away from the conveyor system in order make it easier for loading and unloading of a wafer carrier. In some embodiments, after the removal of the string, the conveyor system can reverse its direction to move the empty wafer carrier back to the other end of the extended induction heater to allow new strips to be loaded onto the wafer carrier and moved into the heated zones. In alternative embodiments, the conveyor system can continue to move in the same direction with another wafer carrier being placed onto the beginning end of the extended induction heater.

Figure 10D:
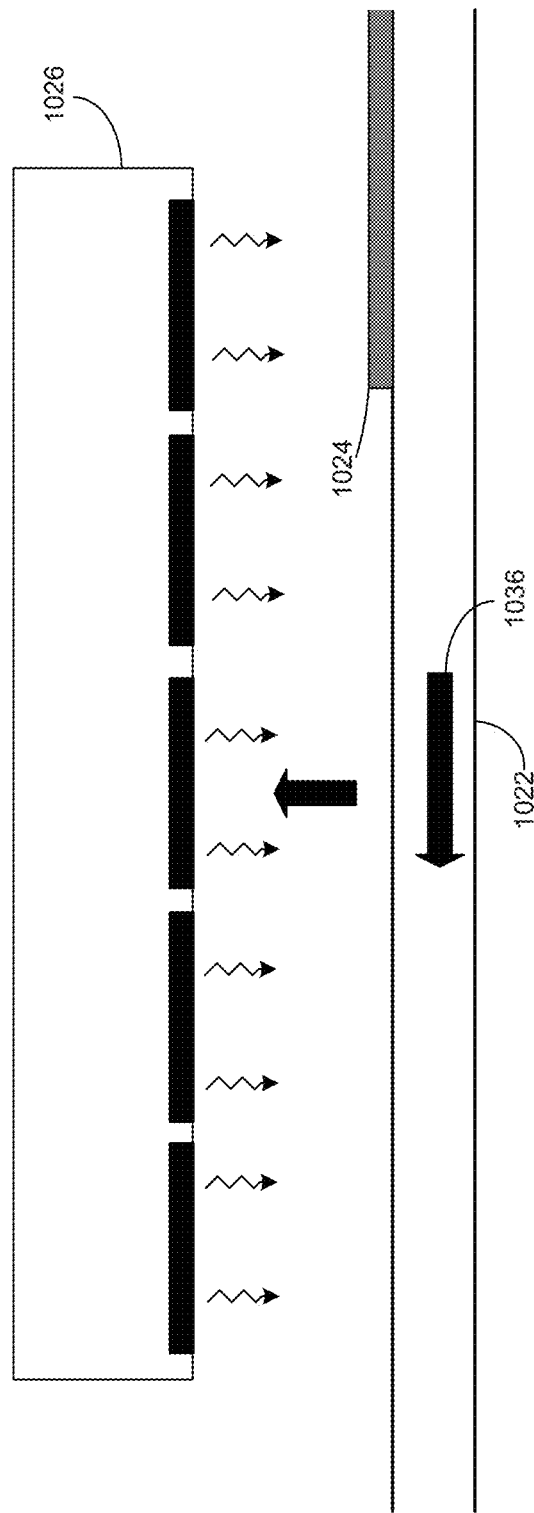
FIG. 10D shows the movement of the empty wafer carrier, according to an embodiment of the present invention.
Figure 10E:
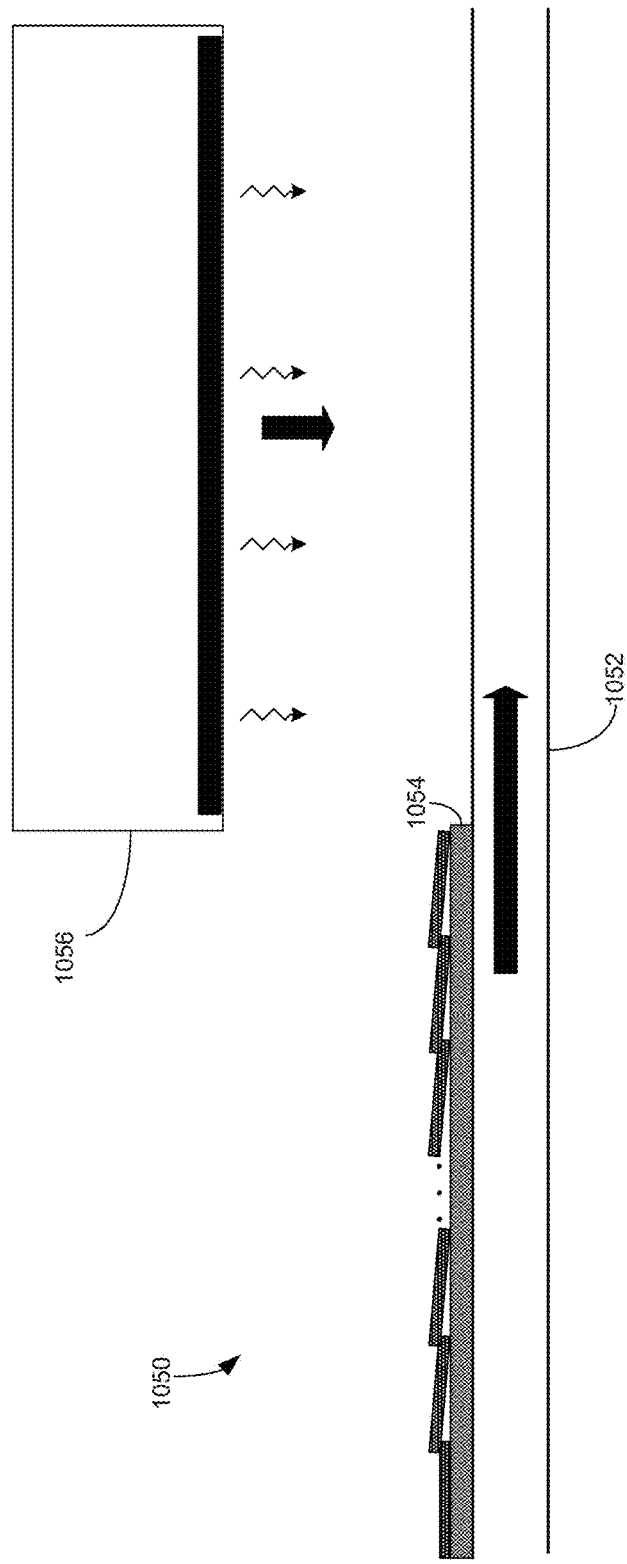
FIG. 10E shows an exemplary inline thermal curing system, according to an embodiment of the present invention.

FIG. 10D shows the movement of the empty wafer carrier, according to an embodiment of the present invention. After the photovoltaic string has been removed from wafer carrier 1024, conveyor system 1022 can reverse its moving direction (indicated by arrow 1036) to move empty wafer carrier 1024 back to the left side of extended induction heater 1026. In addition, extended induction heater 1026 can move up to a predetermined location. In some embodiments, the distance between the surface of extended induction heater 1026 facing the conveyor and the top surface of conveyor system 1022 can be between 0.1 and 4 mm. On the return trip, wafer carrier 1024 does not need to pause.

In the examples shown in FIGS. 10A-10D, the conveyor system can operate in a stop-and-go fashion, which can be less ideal because a stop-and-go conveyor may be prone to mechanical failure. To overcome this problem, in some embodiments, the conveyor system can be configured to move continuously. FIG. 10F shows an exemplary inline thermal curing system, according to an embodiment of the present invention. Inline thermal curing system 1050 can include conveyor system 1052, which carries wafer carrier 1054, and single continuous induction heater 1056. Induction heater 1056 can extend along the length of conveyor system 1052. During operation, a number of strips that make an entire string can be laid onto wafer carrier 1054 before wafer carrier 1054 is sent to the heated region under induction heater 1056. For example, if a string includes 21 strips, all 21 strips will be laid in an edge-overlapping fashion onto the surface of wafer carrier 1054. Induction heater 1056 can be maintained at an initial position that is relatively far away (e.g., between 11 and 20 cm) from the surface of conveyor system 1052. Subsequent to all the strips having been loaded onto wafer carrier 1054, induction heater 1056 can move down to be close to the surface of conveyor system 1052, and conveyor system 1052 can start to move wafer carrier 1054 to the right to be below induction heater 1056. In some embodiments, when wafer carrier 1054 is at least partially below induction heater 1056, the distance between the coil of induction heater 1056 and the photovoltaic strips carrier on wafer carrier 1054 can be between 2 and 11 mm, preferably between 2 and 5 mm. The relatively small distance ensures good heating efficiency. Because induction heater 1056 extends along the direction in which conveyor system 1052 moves, photovoltaic strips carried by wafer carrier 1024 can be heated by induction heater 1056 while moving along with conveyor system 1052. The length of induction heater 1056 and the moving speed of conveyor system 1052 can determine the total amount of time a strip spends underneath induction heater 1056. As discussed previously, ideally the amount of time a strip spends underneath induction heater 1056 is sufficiently long to ensure that conductive paste applied on the strip can be cured. In some embodiments, it may take a strip approximately 6 seconds to travel from one end of induction heater 1056 to the other end.

In the example shown in FIG. 10A, the size of each induction heater can be comparable to the size of the wafer carrier. Hence, in FIG. 10A, the thermal curing system may be used to bond, each time, a group of strips fitted onto a single wafer carrier to form shorter strings. For example, each short string may have three strips. The shorter strings can later be bonded to each other to form a longer string. On the other hand, in the examples shown in FIGS. 10B-10E, the induction heater and the wafer carrier can be much longer. More specifically, the wafer carrier can be long enough to carry a larger number of strips, which can be bonded simultaneously to form a longer string. For example, the longer string can have between 15 and 40 strips. Being able to form longer strings directly from individual strips can increase the system throughput.

Figure 11:
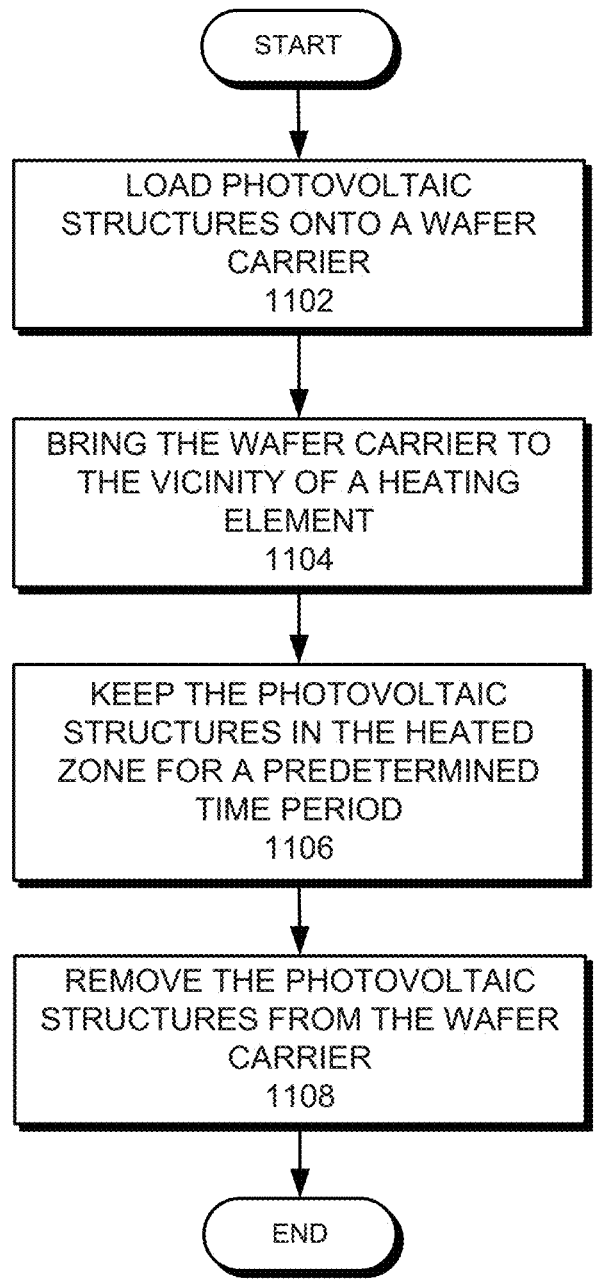
FIG. 11 shows an exemplary process for curing conductive paste applied onto photovoltaic structures, in accordance with an embodiment of the present invention.

FIG. 11 shows an exemplary process for curing conductive paste applied onto photovoltaic structures, in accordance with an embodiment of the present invention. During operation, photovoltaic structures applied with conductive paste can be loaded onto a wafer carrier (operation 1102). The wafer carrier can include a surface that is in direct contact with the photovoltaic structures, and such a surface can be made with thermally insulating and heat-resistant materials. In some embodiments, the surface of the wafer carrier can be made of PBI plastic.

Subsequently, the wafer carrier along with the photovoltaic structures can be brought to the vicinity of a induction heater (operation 1104). The induction heater can produce a varying magnetic field inducing heat in a conductive material positioned in proximity of the induction heater. In some embodiments, the distance between the bottom surface of the induction heater and the wafer carrier can be between 2 and 11 mm to allow efficient heating. The wafer carrier and the photovoltaic structures can remain in the predetermined zone under the bottom surface of coil of the heater for a predetermined time period to ensure proper curing of the conductive paste (operation 1106). The photovoltaic structure can remain stationary or move along a conveyor system while being heated. After the conductive paste is cured, the photovoltaic structures can be removed from the wafer carrier (operation 1108).

Figure 12:
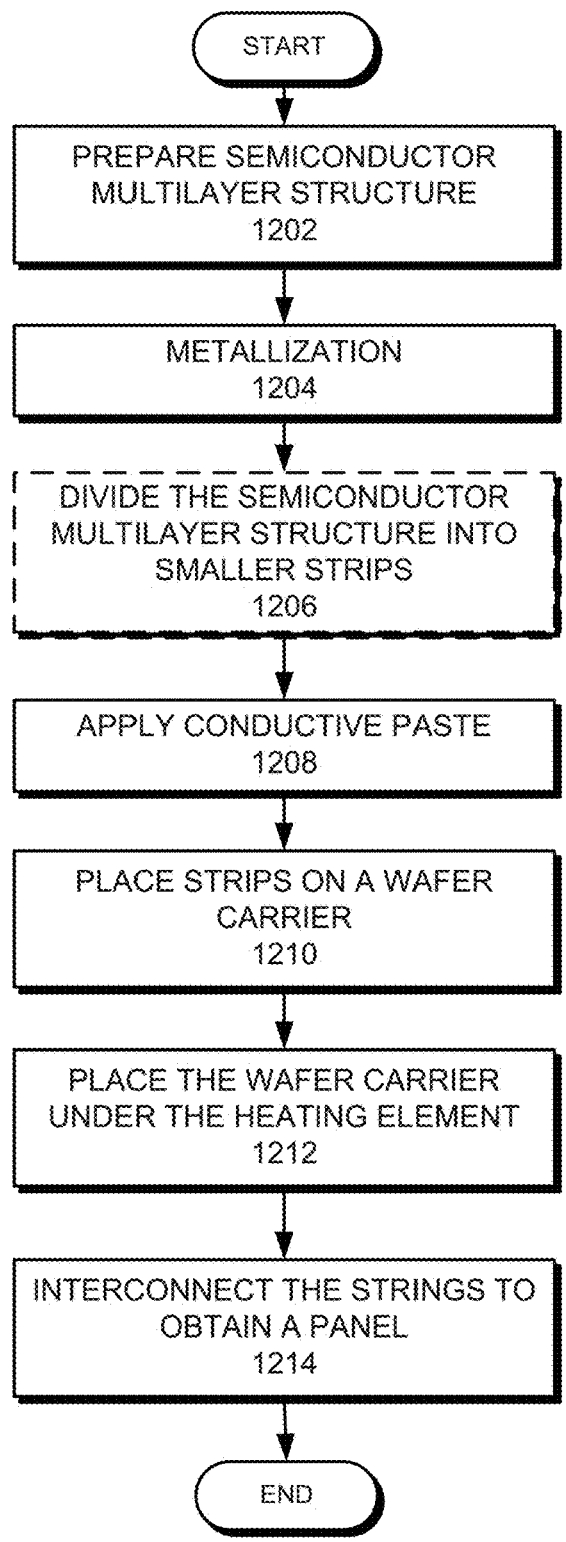
FIG. 12 shows an exemplary process for forming a solar panel, according to an embodiment.

FIG. 12 shows an exemplary process for forming a solar panel, according to an embodiment. During fabrication, a semiconductor multilayer structure can be prepared (operation 1202). The semiconductor multilayer structure can include the base, the emitter, the surface field layer, and one or more transparent conductive oxide (TCO) layers. The semiconductor multilayer can also optionally include quantum tunneling barrier (QTB) layers on one or both sides of the base layer. The semiconductor multilayer structure can then go through a metallization process, which can form a metallic grid on both surfaces of the semiconductor multilayer structure (operation 1204). Different metallization techniques can be used to form the metallic grids. For example, an electroplating process that uses a wax-based plating mask can be used to form the metallic grids.

Subsequently, the photovoltaic structure can optionally be divided into smaller strips (operation 1206), and conductive paste can be applied on an edge busbar of each strip or photovoltaic structure (operation 1208). A number of strips can be placed onto a specially designed wafer carrier having a heat insulation surface, with adjacent strips overlapping at the edges (operation 1210). As a result, the edge busbars of the adjacent strips overlap and the conductive paste is sandwiched between the overlapping busbars.

The specially designed wafer carrier can then be placed under a induction heater that induce heat for a predetermine time to cure the conductive paste (operation 1212). Note that the wafer carrier may remain stationary or may move along a conveyor system during the conductive-paste-curing process. In some embodiments, the induction heater can cause the conduction paste to reach temperature of approximately 300° C. in as little as 6 seconds seconds. The curing of the conductive paste can result in the formation of strings. Finally, the strings can be interconnected to form a panel (operation 1214).

In general, embodiments of the present invention can provide a novel conductive-paste-curing system. The novel system relies on radiation for heat transfer, which can provide better heating uniformity. The efficiency of the system can be improved by the novel design of the radiation block and a wafer carrier with an insulation surface. The throughput of the system can be improved by implementing a conveyor system for inline operation.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A system for curing conductive paste applied on a plurality photovoltaic structures, comprising:
    a wafer carrier for carrying the photovoltaic structures on a first side of the wafer carrier, wherein the wafer carrier includes a base and a strip carrier that is in direct contact with the photovoltaic structures; and
    a heater positioned on the first side of the wafer carrier, wherein the heater includes an induction coil configured to operate near the photovoltaic structures, thereby providing localized induced heat for curing the conductive paste, and
    two shields positioned on the first side of the wafer carrier and configured to shield a magnetic field caused by the induction coil from metallic parts of the photovoltaic structures other than the conductive paste, wherein a gap between the two shields allows the conductive paste to be exposed to the magnetic field produced by the induction coil.

2. The system of claim 1, wherein the strip carrier is made of polybenzimidazole (PBI) plastic.

3. The system of claim 1, wherein the strip carrier is patterned such that a fraction of a surface of the strip carrier is in contact with the photovoltaic structures.

4. The system of claim 1, wherein the strip carrier includes a number of components separated by air gaps to allow an individual component to expand when heated.

5. The system of claim 1, wherein the conductive paste has an induced temperature between 150 and 300° C.

6. The system of claim 1, wherein the heater further includes a core housing element and a power supply providing an alternating current to the induction coil.

7. The system of claim 6, wherein the heater further includes a non-conductive, heat resistant, low magnetic permeability cooling enclosure enclosing the housing element and the induction coil.

8. The system of claim 6, wherein the induction coil is made of a material having a thermal conductivity between 350 and 450 W/(m·k) and an electrical conductivity between 59 and $65 \times 10^{\wedge}6$ S·m.

9. The system of claim 6, wherein the core housing is made of a material having a magnetic permeability between 0.001 and 1.0 H/m.

10. The system of claim 1, wherein the induction heater is positioned approximately 0.1 to 4 millimeters from the conductive paste.

11. A method for curing conductive paste applied on photovoltaic structures, comprising:
    placing a plurality of photovoltaic structures on a first side of a wafer carrier, wherein the wafer carrier includes a base and a strip carrier that is in direct contact with the photovoltaic structures;
    positioning the wafer carrier near an induction heater;
    positioning two shields on the first side of the wafer carrier; and
    providing an alternating current to an induction coil of the induction heater, which by magnetic induction induces a current in the conductive paste applied to the photovoltaic structures, thereby producing heat in the conductive paste to cure the paste;
    wherein the two shields are configured to shield a magnetic field caused by the induction coil from metallic parts of the photovoltaic structures other than the conductive paste, and wherein a gap between the two shields allows the conductive paste to be exposed to the magnetic field produced by the induction coil.

12. The method of claim 11, wherein the strip carrier is made of polybenzimidazole (PBI) plastic.

13. The method of claim 11, wherein the strip carrier includes a number of components separated by air gaps to allow an individual component to expand when heated.

14. The method of claim 11, wherein an induced temperature of the conductive paste is maintained at a predetermined temperature between 150 and 300° C., and wherein the predetermined duration is between 2 and 6 seconds.

15. The method of claim 11, wherein the induction heater further includes a core housing element and a power supply for providing the alternating current to the induction coil.

16. The method of claim 15, wherein the induction heater further includes a non-conductive, heat resistant, low magnetic permeability cooling enclosure enclosing the housing element and the induction coil.

17. The method of claim 15, wherein the induction coil is made of a material having a thermal conductivity between 350 and 450 W/(m·k) and an electrical conductivity between 59 and $65 \times 10^{\wedge}6$ S·m.

18. The method of claim 15, wherein the core housing is made of a material having a magnetic permeability between 0.001 and 1.0 H/m.

19. The method of claim 11, further comprising placing the wafer carrier such that the induction heater is positioned approximately 0.1 to 4 millimeters from the conductive paste.

20. A solar panel fabrication method, comprising:
    obtaining a plurality of photovoltaic structures, wherein a photovoltaic structure includes a first edge busbar on a first edge of a first surface and a second edge busbar on an opposite edge of an opposite surface;
    applying conductive paste on the first edge busbar of each photovoltaic structure;
    aligning the photovoltaic structures on a wafer carrier in such a way that the first edge busbar of a first photovoltaic structure overlaps the second edge busbar of an adjacent photovoltaic structure with the conductive paste sandwiched in between;

positioning two shields on the first side of the wafer carrier; and positioning the wafer carrier near an induction heater such that an induction coil of the induction heater induces current in the conductive paste, which produces heat in the conductive paste for a predetermined duration to cure the paste, thereby mechanically bond the photovoltaic structures to form a string;

wherein the two shields are configured to shield a magnetic field caused by the induction coil from metallic parts of the photovoltaic structures other than the conductive paste, and wherein a gap between the two shields allows the conductive paste to be exposed to the magnetic field produced by the induction coil.

* * * * *